(12) United States Patent
Kobayashi et al.

(10) Patent No.: US 7,371,997 B2
(45) Date of Patent: May 13, 2008

(54) THERMAL PROCESSING APPARATUS AND THERMAL PROCESSING METHOD

(75) Inventors: Toshiyuki Kobayashi, Horikawa-dori (JP); Yoshiro Koyama, Horikawa-dori (JP); Mitsukazu Takahashi, Horikawa-dori (JP)

(73) Assignee: Dainippon Screen Mfg. Co., Ltd. (JP)

( * ) Notice: Subject to any disclaimer, the term of this patent is extended or adjusted under 35 U.S.C. 154(b) by 380 days.

(21) Appl. No.: 11/064,755

(22) Filed: Feb. 1, 2005

(65) Prior Publication Data

US 2005/0149222 A1 Jul. 7, 2005

Related U.S. Application Data

(62) Division of application No. 10/394,895, filed on Mar. 21, 2003, now Pat. No. 6,868,302.

(30) Foreign Application Priority Data

| Mar. 25, 2002 | (JP) | ............................ P2002-082697 |
| Jun. 21, 2002 | (JP) | ............................ P2002-181075 |
| Jul. 16, 2002 | (JP) | ............................ P2002-206439 |

(51) Int. Cl.
*F27B 5/14* (2006.01)
*A21B 2/00* (2006.01)

(52) U.S. Cl. ..................... 219/390; 219/405; 219/411; 392/414; 392/418; 118/724; 118/725; 118/50.1

(58) Field of Classification Search ................ 219/390, 219/405, 411; 392/416, 418; 118/724, 725; 118/50.1
See application file for complete search history.

(56) References Cited

U.S. PATENT DOCUMENTS 6,163,648 A 12/2000 Moto et al.
6,831,258 B2 * 12/2004 Hayasaki et al. ........... 219/502
6,885,815 B2 * 4/2005 Kusuda et al. .............. 392/416
7,038,173 B2 * 5/2006 Takahashi et al. .......... 219/390

FOREIGN PATENT DOCUMENTS

| JP | 2000-058471 | 2/2000 |
| JP | 2000-150405 | 5/2000 |

OTHER PUBLICATIONS

English translation of Abstract from Japanese Patent Application Laid-Open No. 2000-150405.
English translation of Abstract from Japanese Patent Application Laid-Open No. 2000-058471.

* cited by examiner

*Primary Examiner*—Shawntina Fuqua
(74) *Attorney, Agent, or Firm*—Ostrolenk, Faber, Gerb & Soffen, LLP

(57) ABSTRACT

In a thermal processing apparatus, using a lamp for heating a substrate, an opening is formed for a camera unit, which is used to image portions of an auxiliary ring supporting the substrate, to obtain the position of the center of the auxiliary ring. The camera further images the substrate to determine the center of the substrate before the thermal processing apparatus receives and places the substrate on the auxiliary ring. The thermal processing apparatus moves the substrate so that the center thereof coincides with the center of the auxiliary ring, and thereafter places the former on the latter. Thus, the auxiliary ring can be designed to reduce overlaps of the auxiliary ring and the outer edge of the substrate while overlaps can be uniform over the entire circumference of the substrate to improve temperature uniformity of the substrate.

12 Claims, 26 Drawing Sheets

A-A

F I G . 8
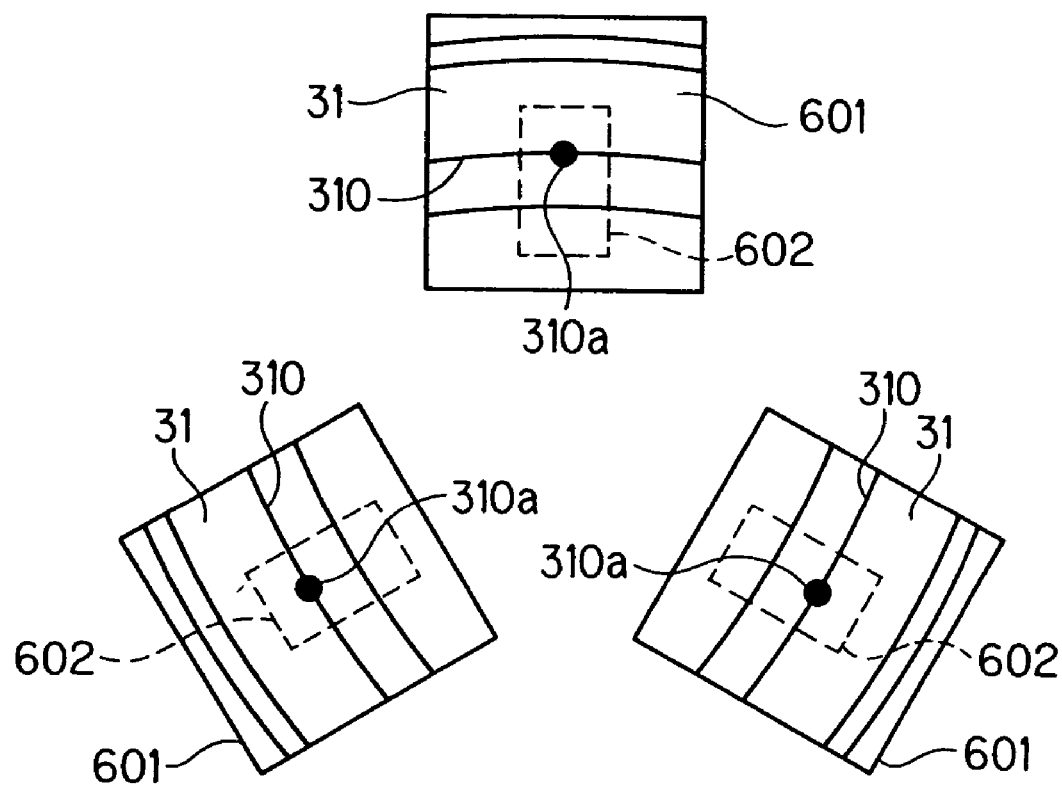

F I G . 1 1
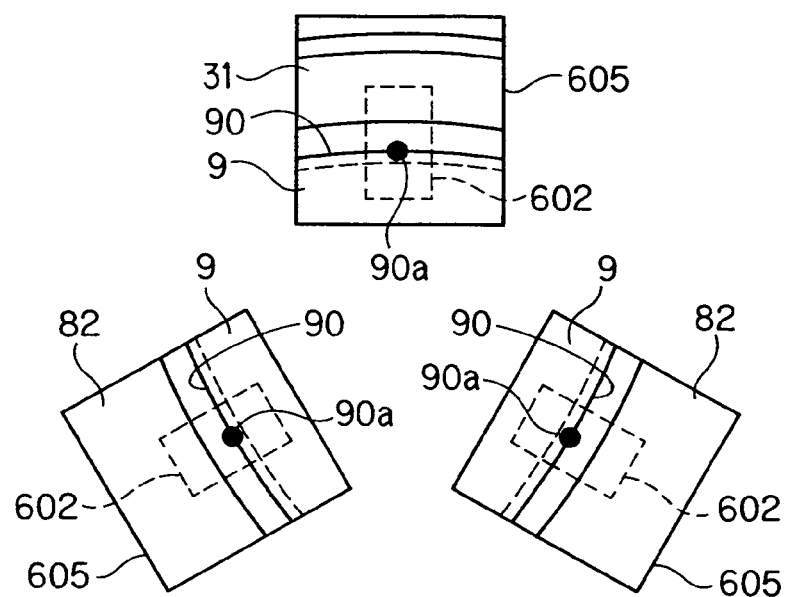
F I G . 1 2
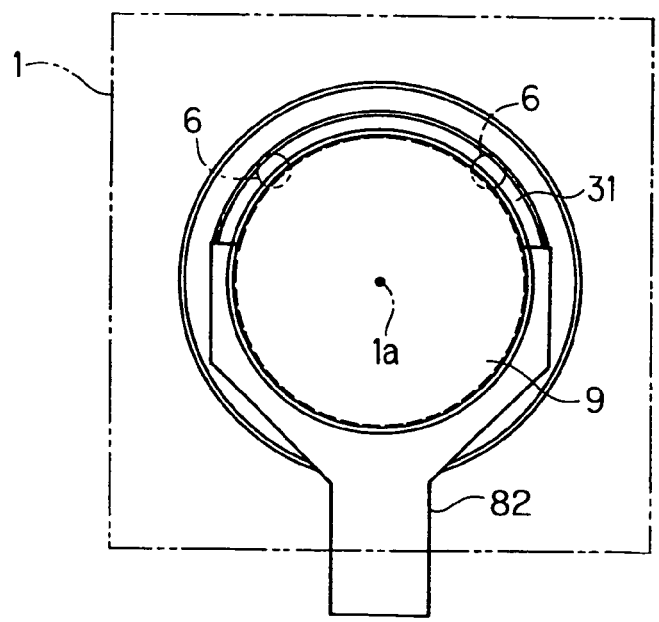

| SAMPLE NO. | SUPPORT PART THICKNESS T [mm] | SUPPORT WIDTH W [mm] | (T×W) [mm²] |
|---|---|---|---|
| 1 | 0.4 | 3.0 | 1.2 |
| 2 | 0.4 | 3.0 | 1.2 |
| 3 | 0.4 | 1.0 | 0.4 |
| 4 | 0.3 | 3.0 | 0.9 |
| 5 | 0.3 | 2.0 | 0.6 |

THERMAL PROCESSING APPARATUS AND THERMAL PROCESSING METHOD

CROSS REFERENCE TO RELATED APPLICATION

This is a division under 37 C.F.R. §1.53(b) of prior application Ser. No. 10/394,895, filed Mar. 21, 2003 now U.S. Pat. No. 6,868,302 by Toshiyuki KOBAYASHI, et al., entitled THERMAL PROCESSING APPARATUS AND THERMAL PROCESSING METHOD, the contents of which are incorporated herein by reference.

BACKGROUND OF THE INVENTION

1. Field of the Invention

The present invention relates to a technique of heating a substrate with light.

2. Description of the Background Art

As the requirement for refinement of a device such as a semiconductor device is increased, a rapid thermal process (hereinafter abbreviated as "RTP") has been going to play an important role as one of heating steps for a semiconductor substrate (hereinafter referred to as "substrate"). The RTP is performed mainly with a lamp employed as a heat source. Briefly stated, a processing chamber is kept in a prescribed gas atmosphere for heating a substrate to a prescribed temperature (e.g., 1100° C.) in several minutes (temperature increase step), maintaining the substrate at the temperature for a constant time (e.g., several 10 seconds) (holding step) and thereafter turning off the lamp thereby rapidly cooling the substrate.

The RTP is employed for performing processing such as that of preventing an impurity from thermal re-diffusion in a junction layer of a transistor formed on a substrate or that of reducing the thickness of an insulator film such as an oxide film, for example, which has been hard to implement through prolonged thermal processing in a conventional electric furnace.

A thermal processing apparatus performing the RTP may be provided with an auxiliary ring coming into contact with the outer edge of a substrate thereby supporting the substrate and a screening ring covering the outer side of the auxiliary ring. The auxiliary ring is integrally heated with the substrate thereby improving temperature uniformity on the surface of the substrate while preventing a thermometer arranged on the back side of the substrate for measuring the temperature of the substrate during the RTP from direct incidence of light from a lamp. The screening ring is provided for forming an optical labyrinth on the outer edge of the auxiliary ring while preventing the thermometer from incidence of light from outside the auxiliary ring.

The auxiliary ring has tolerance in preparation, while the center of the substrate placed thereon deviates from the center of the auxiliary ring. The auxiliary ring is arranged in the apparatus in a state placed on a support member, and hence the position of the auxiliary ring changes due to difference between the thermal expansion coefficients of the auxiliary ring and the support member when thermal processing is repeated. Particularly when processing a large-sized substrate having a diameter of about 300 mm, movement of the auxiliary ring is increased. In consideration of the aforementioned various factors, a conventional thermal processing apparatus is so designed as to sufficiently provide overlaps of the substrate and the auxiliary ring so that no clearance is defined between the substrate and the auxiliary ring when the former is placed on the latter to introduce light from the lamp into the thermometer.

Further, clearances (the so-called "slacks") are provided on engaging portions between the auxiliary and screening rings and members supporting these rings respectively, for preventing the rings from cracking resulting from expansion in heating. When the thermal processing is repeated, therefore, the positions of the auxiliary ring and the screening ring change, i.e., the positions of the centers of the auxiliary ring and the screening ring deviate from the center of the substrate, due to difference between the temperatures or the thermal expansion coefficients of the rings and the members supporting the same. In consideration of this factor, the conventional thermal processing apparatus is so designed as to sufficiently increase the overlaps between these structures so that no clearance is defined between the substrate and the auxiliary ring or between the auxiliary ring and the screening ring to introduce the light from the lamp into the thermometer also when displacement is caused.

If the substrate and the auxiliary ring largely overlap with each other, however, the thermal capacity of the outer edge of the substrate (apparent thermal capacity in consideration of influence by the thermal capacity of the auxiliary ring) is increased in heating, to result in temperature irregularity (such ununiformity that the temperature of the outer edge is relatively reduced in heating and relatively increased in cooling) allowing no compensation through adjustment of the lamp output between a portion around the center of the substrate and the outer edge thereof. Also when the centers of the substrate and the auxiliary ring deviate from each other, the overlaps get inconstant on the outer edge of the substrate, and hence the thermal capacity gets ununiform on the outer edge of the substrate, leading to temperature irregularity.

When the auxiliary ring and the screening ring largely overlap with each other, there is such a possibility that the temperature is relatively slowly increased on the outer edge of the auxiliary ring when heating the substrate, to crack the auxiliary ring due to excess stress resulting from temperature difference between the outer edge and the inner periphery. When the centers of the auxiliary ring and the screening ring deviate from each other, it follows that temperature uniformity of the auxiliary ring is reduced to also reduce temperature uniformity of the substrate as a result.

Consequently, it is difficult to suppress dispersion of the thickness in formation of an oxide film or the like, for example, within a range more strictly required in the future. Exemplary formation of an oxide film in a conventional thermal processing apparatus is now described.

FIG. 1 illustrates time change of a substrate temperature in the RTP. The horizontal axis and the vertical axis show the time and the substrate temperature respectively. Referring to FIG. 1, a temperature increase step of increasing the substrate temperature is carried out between times t1 and t2, and a holding step of keeping the substrate temperature at a target level A is carried out between the time t2 and a time t3. FIG. 2 shows the relation between positions on the substrate and the thickness of the oxide film in the case of performing such an RTP. The horizontal axis and the vertical axis show the distance from the center of the substrate and the average thickness of the oxide film with respect to the distance respectively.

As shown in FIG. 2, the thickness is stable inside a portion around a distance R1, i.e., the side of the center of the substrate, while the thickness is abruptly increased when approaching a distance R2 corresponding to the outer edge of the substrate. This is conceivably because the temperature of the auxiliary ring exceeds the substrate temperature in the holding step and the temperature of the outer edge of the substrate exceeds that of the inner part due to heat conducted from the auxiliary ring.

Following requirement for further pattern refinement, reduction of temperature irregularity of substrates resulting from influence by respective ring-shaped members (an auxiliary ring and a screening ring) provided outside the substrates has recently been increasingly required.

SUMMARY OF THE INVENTION

The present invention is intended for a technique for reducing displacement between a substrate and an auxiliary ring thereby suppressing overlaps and rendering the overlaps constant for improving temperature uniformity of the substrate in heating.

A thermal processing apparatus according to a preferred embodiment of the present invention, capable of heating a substrate with light, comprises a lamp irradiating the substrate with the light, a ring enclosing the outer edge of the substrate and outwardly spreading from the outer edge, and an image pickup system capturing images of a plurality of portions of the ring.

Thus, the thermal processing apparatus can correctly position the substrate in response to the ring. When placing the substrate on the ring, the thermal processing apparatus can render overlaps small and constant, for improving temperature uniformity of the substrate in thermal processing.

The present invention is also directed to a thermal processing apparatus comprising a lamp irradiating a substrate with light, a ring member enclosing the outer edge of the substrate and outwardly spreading from the outer edge (this ring member has a first surface) and a support member supporting the ring member (this support member has a second surface opposed to the first surface).

Thus, a clearance between the first and second surfaces is reduced due to contraction of the ring member or the support member in temperature reduction, whereby the thermal processing apparatus can limit displacement of the ring member.

Preferably, the ring member is a ring supporting the outer edge of the substrate from below.

Thus, the thermal processing apparatus can block light directed downward below the substrate and improve temperature uniformity of the substrate in heating.

The present invention is also directed to a thermal processing apparatus comprising a lamp irradiating a substrate with light and a ring having an annular support part coming into contact with the outer edge of the substrate for supporting the outer edge from below and outwardly spreading from the outer edge, while a numerical value obtained in terms of "$mm^2$" of the product (area) of a support width of a portion where the outer edge of the substrate and the support part overlap with each other and the thickness of the support part is rendered not more than twice a numerical value obtained in terms of "mm" of the thickness (length) of the substrate.

Thus, the thermal processing apparatus employing the lamp can improve temperature uniformity of the heated substrate.

Accordingly, an object of the present invention is to improve uniformity of a substrate temperature in processing of irradiating the substrate with light from a lamp for heating the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 illustrates images captured in the image pickup parts;

FIG. 11 illustrates images captured in the image pickup parts;

FIG. 12 is a plan view showing a thermal processing apparatus according to a second preferred embodiment of the present invention;

FIG. 37 illustrates exemplary values of a support part thickness T and a support width W.

DESCRIPTION OF THE PREFERRED EMBODIMENTS

Figure 3:
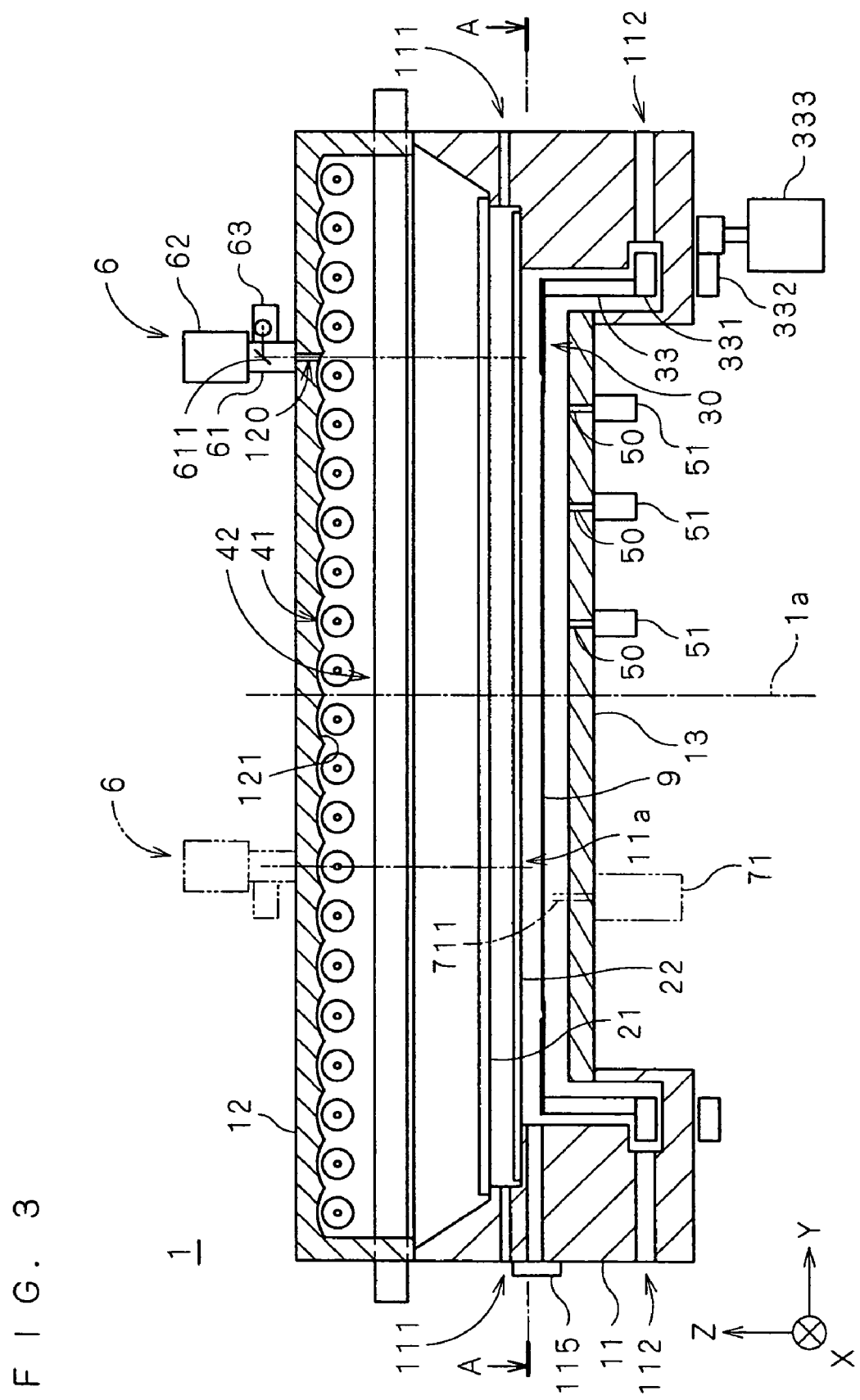
FIG. 3 is a longitudinal sectional view showing the structure of a thermal processing apparatus according to a first preferred embodiment of the present invention.

FIG. 3 is a longitudinal sectional view showing the structure of a thermal processing apparatus 1 according to a first preferred embodiment of the present invention. FIG. 3 omits parallel oblique lines with respect to sections of details.

The thermal processing apparatus 1 irradiates a substrate 9 with light in a prescribed atmosphere thereby performing various thermal processing (oxidization, annealing, CVD etc.) accompanied by heating. In the thermal processing apparatus 1, a body part 11 forming the apparatus body, a lid part 12 covering the upper portion of the body part 11 and a reflector 13 arranged on the central bottom surface of the body part 11 form a chamber. A chamber window 21 of quartz vertically partitions the internal space of the chamber, and a support ring group 30 supports the substrate 9 in a lower processing space 11a. An O-ring (not shown) seals the clearance between the chamber window 21 and the body part 11, which has a cylindrical inner side surface.

A plurality of gas inlets 111 and a plurality of outlets 112 are formed on the side wall of the body part 11. The processing space 11a performs gas replacement by (enforcedly) discharging gas from the outlets 112 while introducing gas (e.g., nitrogen, oxygen or the like) responsive to the type of processing performed on the substrate 9 through the gas inlets 111. The thermal processing apparatus 1 is provided with a shower plate 22 of quartz formed with a large number of holes between the substrate 9 and the chamber window 21, for homogeneously supplying the gas introduced from the gas inlets 111 to the upper surface of the substrate 9 through the shower plate 22. The gas employed for the processing is guided to the outlets 112 from below the processing space 11a.

A cylindrical member 33 centered at a central axis 1a of the apparatus 1 supports the support ring group 30, while a coupling member 331 is mounted on the lower end of the cylindrical member 33. Another coupling member 332 opposed to the coupling member 331 is provided under the body part 11 so that the coupling members 331 and 332 form a magnetic coupling mechanism. The coupling member 332 rotates about the central axis 1a through a motor 333. Thus, the coupling member 331 provided in the body part 11 rotates due to magnetic action, while the substrate 9 and the support ring group 30 rotate about the central axis 1a while keeping the direction of the main surface constant.

Figure 4:
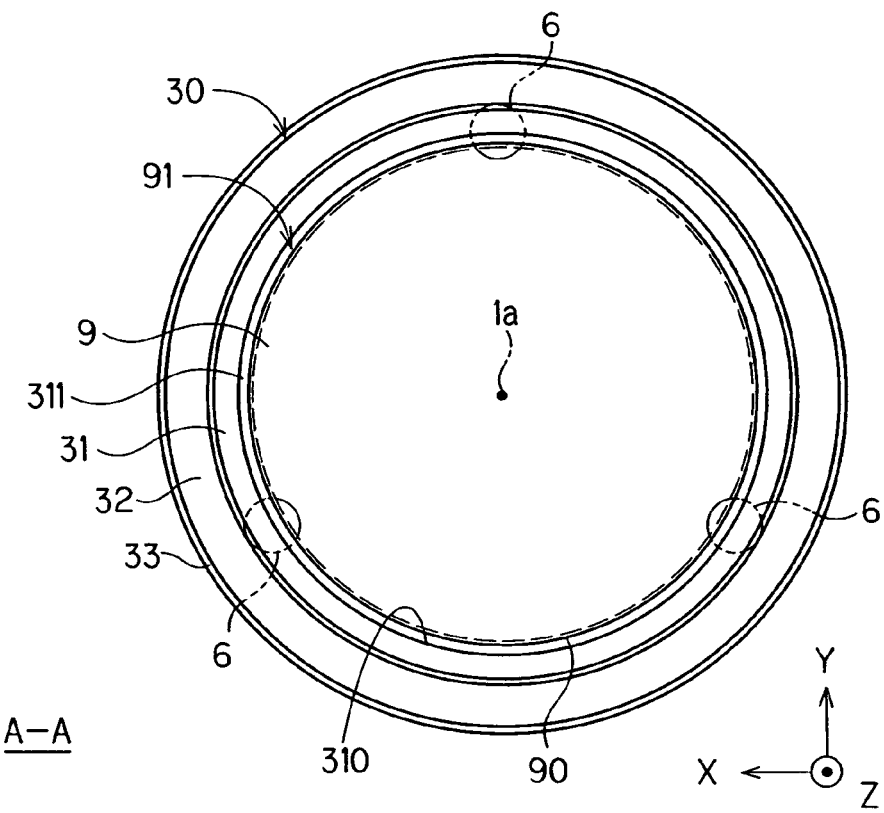
FIG. 4 is a plan view showing the inside of a cylindrical member.
Figure 5:
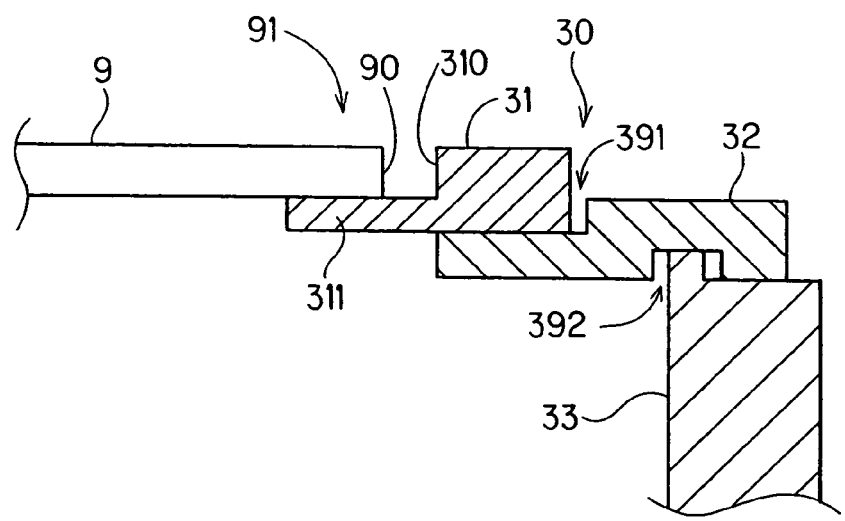
FIG. 5 is an enlarged sectional view showing a support ring group supporting a substrate.

FIG. 4 illustrates the inside of the cylindrical member 33 along arrows A in FIG. 3, and FIG. 5 is an enlarged sectional view showing the support ring group 30 supporting the substrate 9.

As shown in FIGS. 4 and 5, the support ring group 30 is formed by an annular auxiliary ring 31 receiving the substrate 9 thereon and an annular cushion ring 32 supporting the auxiliary ring 31 from outside. Both of the auxiliary ring 31 and the cushion ring 32 are made of silicon carbide (SiC) having specific heat capacity close to that of the substrate 9, and the auxiliary ring 31 is heated integrally with the substrate 9 thereby improving in-plane uniformity of the temperature of the substrate 9.

The auxiliary ring 31 has an annular support part 311 projecting toward the central axis 1a on its inner peripheral surface 310. The support part 311 comes into contact with an outer edge 91 of the substrate 9 transported into the processing space 11a by an external transport mechanism from below thereby supporting the substrate 9. When the substrate 9 is placed on the auxiliary ring 31, an outer peripheral surface 90 of the substrate 9 and an inner peripheral surface 310 of the auxiliary ring 31 are opposed to each other while the auxiliary ring 31 is positioned to outwardly spread from the outer edge 91 of the substrate 9.

The cylindrical member 33 supports the cushion ring 32 supporting the auxiliary ring 31 (see FIG. 3). As shown in FIG. 5, engaging portions 391 and 392 between the auxiliary ring 31 and the cushion ring 32 and between the cushion ring 32 and the cylindrical member 33 have clearances (slacks) respectively. Also when swollen with heat, therefore, the auxiliary ring 31 and the cushion ring 32 are prevented from cracking resulting from excess stress. The auxiliary ring 31 and the cushion ring 32 may be partly recessed as long as their functions are fulfilled.

As shown in FIG. 3, the lower surface of the lid part 12 of the thermal processing apparatus 1 defines a reflecting surface (hereinafter referred to as "reflector") 121 opposed to the upper surface of the substrate 9, and a bar-shaped upper lamp group 41 is arranged along the reflector 121 so that respective lamps are along a direction X. The reflector 121 reflects a component of light upwardly emitted from the upper lamp group 41 and applies the same to the substrate 9. The upper lamp group 41 is formed by infrared halogen lamps, for example. A bar-shaped lower lamp group 42 is arranged under the upper lamp group 41, i.e., between the upper lamp group 41 and the substrate 9, so that respective lamps are along a direction Y perpendicularly to the upper lamp group 41.

Each of the upper and lower lamp groups 41 and 42 is divided into small groups in response to distances from the central axis 1a, and the groups are individually connected to a lamp control part and supplied with power independently of each other.

A plurality of radiation thermometers 51 are mounted under the substrate 9 outwardly from the central axis 1a, The radiation thermometers 51 receive infrared light from the substrate 9 through a window member 50 provided on the reflector 13 thereby measuring the temperature of the substrate 9. The plurality of radiation thermometers 51 measure the temperature of the substrate 9 placed on the support ring group 30 and rotated in response to distances from the central axis 1a. At this time, the substrate 9, the support ring group 30 and the cylindrical member 33 inhibit infrared radiation from the lamp groups 41 and 42 from entering the radiation thermometers 51, so that the radiation thermometers 51 correctly measure the temperature.

When performing processing accompanied by heating, the thermal processing apparatus 1 controls power supplied to each group of the lamp groups 41 and 42 in response to results of measurement of the radiation thermometers 51. At this time, a rotation mechanism formed by the motor 333 and the coupling mechanism rotates the substrate 9 and the support ring group 30, and the thermal processing apparatus 1 controls heating of the substrate 9 so that the temperature of the substrate 9 is as uniform as possible.

The thermal processing apparatus 1 is further provided with three camera units 6 on the lid part 12. The camera units 6 capture images of the auxiliary ring 31 through openings 120 of 5 mm in diameter, for example, formed in the lid part 12. The camera units 6 comprise image pickup parts 62 and light source parts 63 mounted on optical units 61, so that half mirrors 611 provided in the optical units 61 reflect light from the light source parts 63 and guide the reflected light to the auxiliary ring 31 as illumination light through the openings 120. Light from the auxiliary ring 31 is transmitted through the half mirrors 611 and guided to the image pickup parts 62. The three camera units 6 are mounted on positions rotated by 120° from each other about the central axis 1a, as shown by phantom lines in FIG. 4.

As shown in FIG. 3, a plurality of lift mechanisms 71 (FIG. 3 illustrates only a single lift mechanism 71 with two-dot chain lines) vertically moving lift pins 711 are mounted on the lower surface of the reflector 13 provided on the lower portion of the apparatus 1, while an openable/closeable gate 115 is provided on the side surface of the body part 11. When an external transport robot 8 (see FIG. 6) introduces or discharges the substrate 9 into or from the thermal processing apparatus 1 through the gate 115, the lift mechanisms 71 bring the lift pins 711 into contact with the lower surface of the substrate 9 for vertically moving the substrate 9, thereby transferring the substrate 9 between an arm 82 (see FIG. 9) of the transport robot 8 and the lift pins 711.

Figure 6:
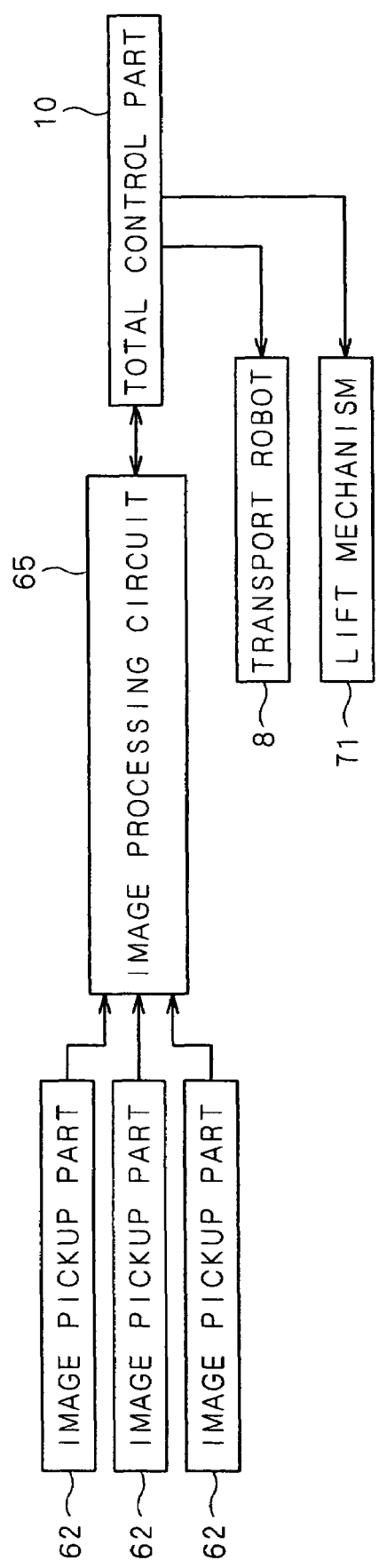
FIG. 6 is a block diagram showing the connectional relation between image pickup parts and the remaining structures of the thermal processing apparatus.

FIG. 6 is a block diagram showing the connectional relation between the image pickup parts 62 of the three camera units 6 and the remaining structures of the thermal processing apparatus 1. The image pickup parts 62 are connected to an image processing circuit 65, which in turn processes images captured by the image pickup parts 62. The image processing circuit 65 inputs results of the processing in a total control part 10 controlling total operations of the thermal processing apparatus 1, so that the total control part 10 controls the external transport robot 8 and the lift mechanisms 71. Thus, the thermal processing apparatus 1 correctly matches the centers of the substrate 9 and the auxiliary ring 31 with each other when receiving the substrate 9 as described later.

The total operations of the thermal processing apparatus 1 are now described mainly with reference to an operation of receiving the substrate 9 therein.

Figure 7:
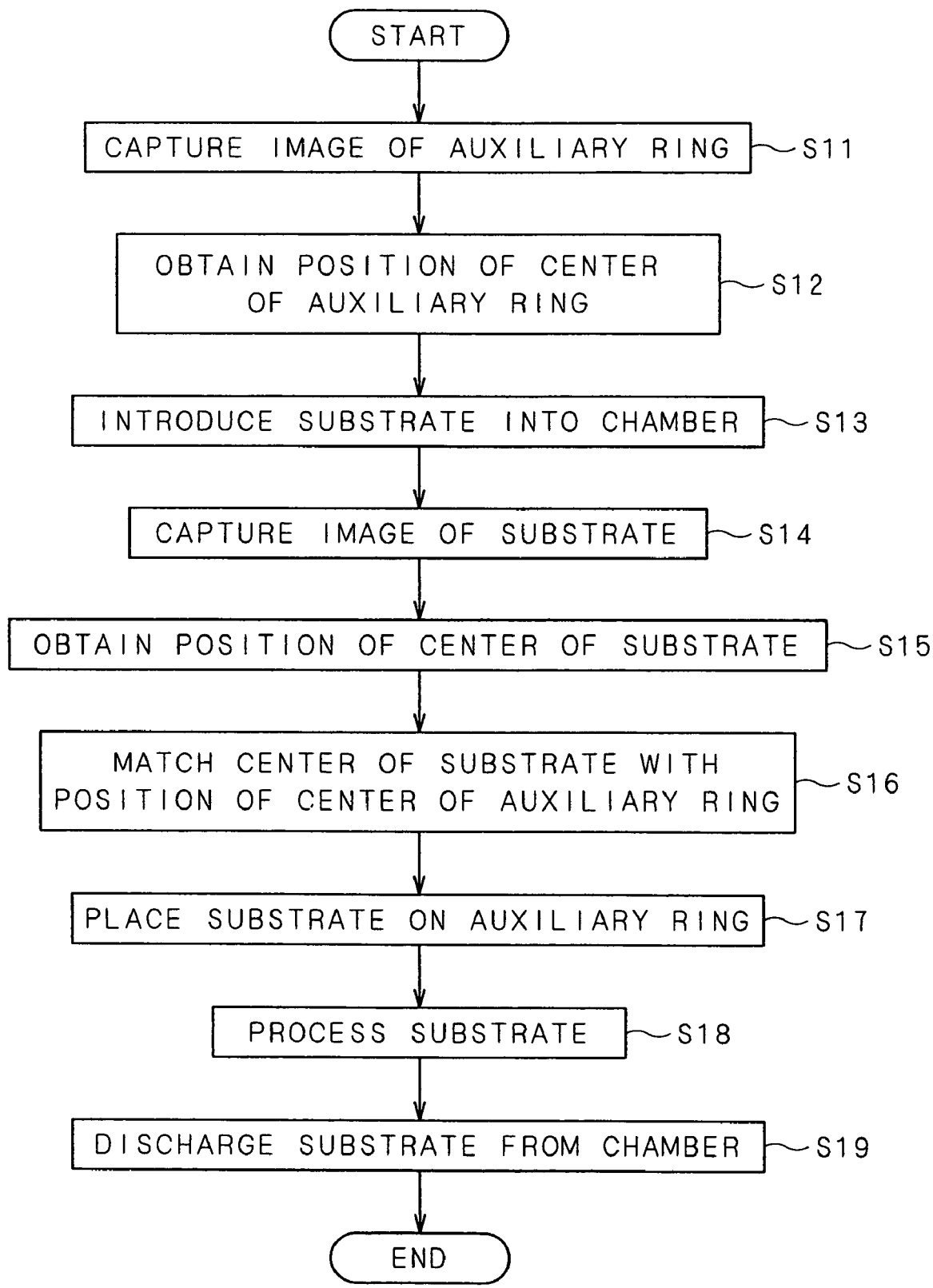
FIG. 7 illustrates the flow of operations of the thermal processing apparatus.

FIG. 7 illustrates the flow of the operations of the thermal processing apparatus 1. First, the three camera units 6 capture images of the auxiliary ring 31 before the substrate 9 is introduced into the thermal processing apparatus 1 (step S11). FIG. 8 illustrates three images 601 captured by the image pickup parts 62 in consideration of the directions of the captured images 601.

Then, the thermal processing apparatus 1 obtains the position of the center of the auxiliary ring 31 with the three images 601 (step S12). More specifically, the image pickup parts 62 input the captured images 601 in the image processing circuit 65 as shown in FIG. 6, so that the image processing circuit 65 performs processing such as edge extraction and detection of tangential lines with reference to the central axis 1a of the apparatus 1 in processed areas 602 shown in FIG. 8 and specifies points 310a on the inner peripheral surface 310 (see FIG. 5) of the auxiliary ring 31. The thermal processing apparatus 1 previously sets the processed areas 602 and a method of detecting the arcuate tangential lines, for example, by introducing a dummy disk having a known shape.

The thermal processing apparatus 1 previously captures the positions of the three camera units 6 through polar coordinates expressed by the distances and directions from the central axis 1a thereof, for example, and also previously inputs the imaging ranges of the camera units 6 in the total control part 10. When receiving the coordinates of the three points 310a in the images 601, the total control part 10 obtains the absolute positions of the three points 310a with reference to the thermal processing apparatus 1, and further obtains the center coordinates of a circle passing through the three points 310a. In other words, the total control part 10 substitutes the coordinates of the three points 310a in an equation of the circle with unknowns of the center coordinates of the auxiliary ring 31 and the radius of the inner peripheral surface 310 and solves the equation, thereby specifying the position of the center of the auxiliary ring 31 (with respect to the central axis 1a, for example) and the radius of the inner peripheral surface 310.

Figure 9:
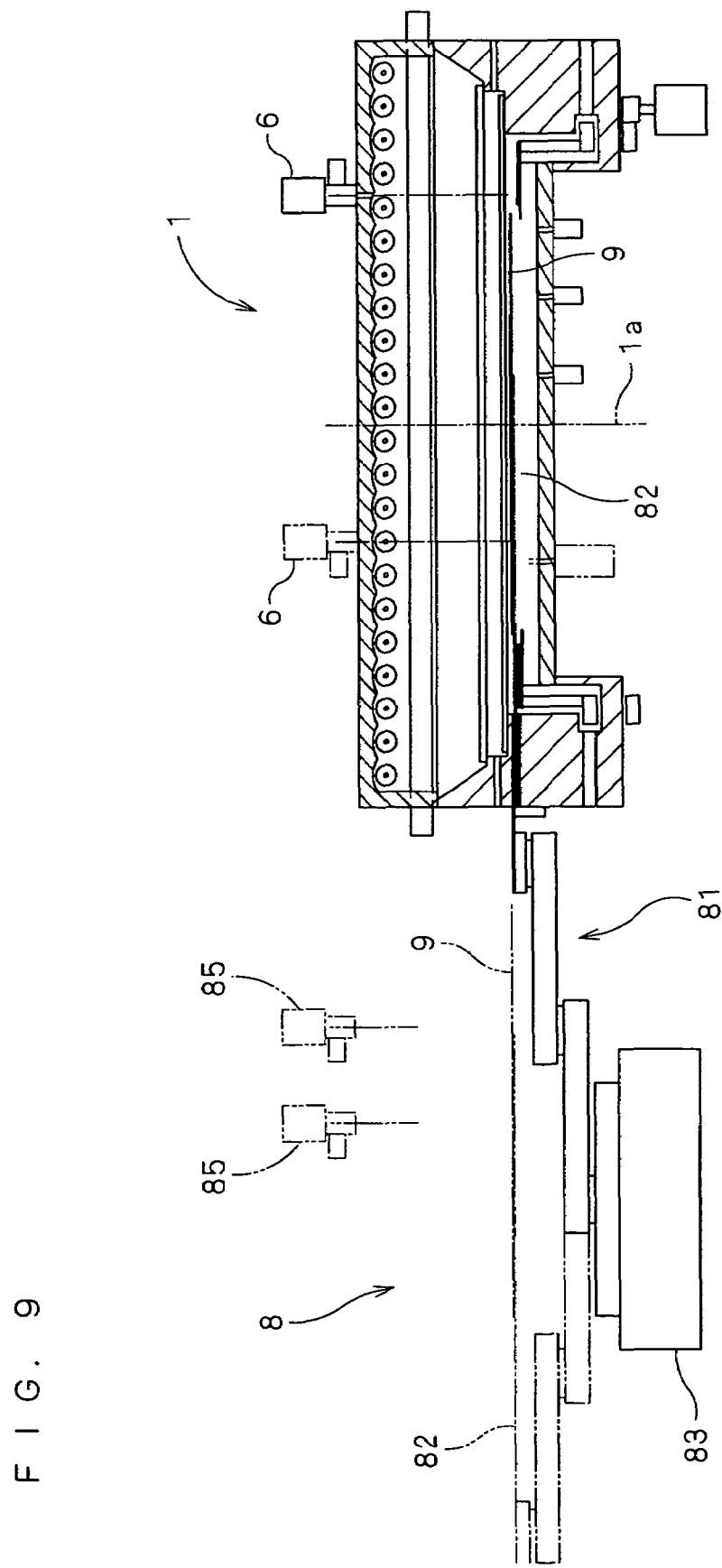
FIG. 9 is a front view of the thermal processing apparatus receiving the substrate.
Figure 10:
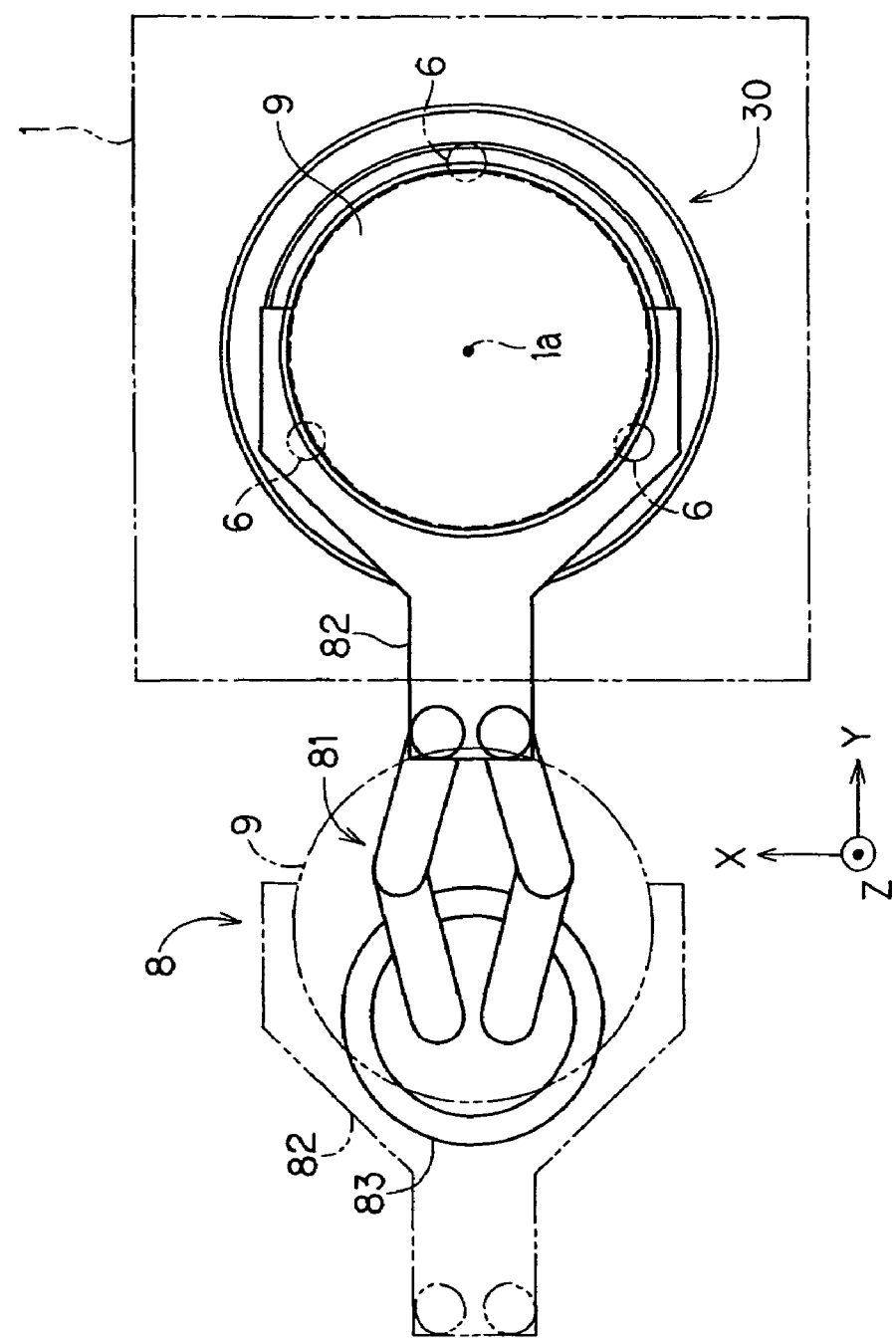
FIG. 10 is a plan view of the thermal processing apparatus receiving the substrate.

Then, the external transport robot 8 introduces the substrate 9 into the thermal processing apparatus 1, i.e., into the chamber (step S13). FIGS. 9 and 10 are a front view and a plan view showing the substrate 9 introduced into the thermal processing apparatus 1 respectively.

The transport robot 8 reciprocates the arm 82 holding the substrate 9 with respect to the thermal processing apparatus 1 through a frog leg mechanism 81, which in turn is rotated by a rotation mechanism 83 about a vertical axis. The total control part 10 controls the transport robot 8 to introduce the substrate 9 temporarily to a position where the center of the substrate 9 substantially coincides with the central axis 1a of the thermal processing apparatus 1. Thus, the thermal processing apparatus 1 positions the outer peripheral surface 90 (see FIG. 5) of the substrate 9 under the camera units 6.

In this state, the camera units 6 capture images of the outer edge 91 of the substrate 9 again (step S14). FIG. 11 illustrates images 605 captured by the three image pickup parts 62. The image processing circuit 65 performs image processing on processed areas 602 in the images 605 similarly to the step S12, and specifies points 90a on the outer peripheral surface 90 of the substrate 9. The total control part 10 obtains the center of a circle passing through the three points 90a thereby calculating the position of the center of the substrate 9 (with respect to the central axis 1a, for example) (step S15).

The total control part 10 obtains displacement of the center of the substrate 9 with respect to the center of the auxiliary ring 31 as motion vectors in the directions X and Y, for example, and controls the transport robot 8 to match the centers of the substrate 9 and the auxiliary ring 31 with each other (step S16). While the transport robot 8 rotates/moves the substrate 9 with the rotation mechanism 83 as shown in FIG. 10 and changes the radius of rotation with the frog leg mechanism 81, justification of the substrate 9 is slight with respect to the size of the substrate 9, e.g., within 2 mm for the substrate 9 of 300 mm in diameter, and hence the frog leg mechanism 81 performs positioning in the direction Y and the rotation mechanism 83 performs positioning in the direction X.

The thermal processing apparatus 1 sets positioning accuracy to not more than 0.1 mm, for example, while also setting the resolution of the image pickup parts 62 imaging areas of about 40 mm square through CCDs each having at least 512 by 480 pixels to not more than 0.1 mm.

Thereafter the total control part 10 controls the lift mechanisms 71 so that the lift pins 711 push up the substrate 9, the arm 82 retreats outward and the lift pins 711 move down thereby placing the substrate 9 on the support part 311 of the auxiliary ring 31 (step S17). Due to the aforementioned operations, the thermal processing apparatus 1 places the substrate 9 on the auxiliary ring 31 while matching the centers thereof with each other so that overlaps of the support part 311 of the auxiliary ring 31 and the substrate 9 have uniform widths along the overall outer periphery of the substrate 9.

When placing the substrate 9 on the auxiliary ring 31, the thermal processing apparatus 1 closes the gate 115 shown in FIG. 3, supplies the processing space 11a with an atmosphere of processing gas and rotates the substrate 9 with the auxiliary ring 31 for thermally processing the substrate 9 with the lamps (step S118). When completing the thermal processing, the thermal processing apparatus 1 replaces the gas in the processing space 11a and opens the gate 115, so that the lift pins 711 push up the substrate 9. The transport robot 8 inserts the arm 82 into a portion under the substrate 9, so that the lift pins 711 move down to place the substrate 9 on the arm 82. The arm 82 discharges the substrate 9 from the thermal processing apparatus 1 (step S19).

The aforementioned thermal processing apparatus 1 according to the first preferred embodiment captures the images 601 of the auxiliary ring 31 with the three image pickup parts 62 and obtains the position of the center of the auxiliary ring 31 before the transport robot 8 introduces the substrate 9 into the same. Further, the thermal processing apparatus 1 captures the images 605 of the outer edge 91 of the substrate 9 with the three image pickup parts 62 and obtains the position of the center of the substrate 9 before placing the introduced substrate 9 on the auxiliary ring 31. Therefore, the thermal processing apparatus 1 can obtain the centers of the auxiliary ring 31 and the substrate 9 also when the diameter of the auxiliary ring 31 (more correctly, the diameter of the inner peripheral surface 310) or the outer diameter of the substrate 9 is unknown.

Thus, also when the auxiliary ring 31 positionally deviates from the central axis 1a of the apparatus 1, the thermal processing apparatus 1 can place the substrate 9 on the auxiliary ring 31 so that the centers thereof coincide with each other, thereby rendering the overlaps of the outer edge 91 of the substrate 9 and the auxiliary ring 31 constant. Consequently, the shape of the auxiliary ring 31 can be so designed as to sufficiently reduce the overlaps, and thermal capacity on the outer edge 91 of the substrate 9 can be suppressed small in consideration of heat transfer between the substrate 9 and the auxiliary ring 31. Further, the thermal capacity of the outer edge 91 can be inhibited from dispersion due to the constant overlaps. Consequently, the thermal processing apparatus 1 can improve temperature uniformity of the overall substrate 9 for implementing proper thermal processing on the substrate 9.

The thermal processing apparatus 1 according to the first preferred embodiment, measuring the auxiliary ring 31 and the substrate 9 with the three camera units 6, may alternatively measure the substrate 9 before receiving the same. For example, a plurality of camera units 85 may be provided outside the thermal processing apparatus 1 as shown by phantom lines in FIG. 9, for obtaining the center of the substrate 9 held by the transport robot 8. In this case, it follows that the steps S14 and S15 shown in FIG. 7 are separately carried out before the transport robot 8 introduces the substrate 9 into the thermal processing apparatus 1. Further alternatively, the thermal processing apparatus 1 may mechanically position the substrate 9 to locate the center of the substrate 9 on a prescribed position with respect to the arm 82.

FIG. 12 illustrates a thermal processing apparatus 1 according to a second preferred embodiment of the present invention in a similar manner to FIG. 10. The thermal processing apparatus 1 according to the second preferred embodiment is similar to that according to the first preferred embodiment except that two camera units 6 are provided at an angle of about 90° with respect to a central axis 1a of the apparatus 1.

When the thermal processing apparatus 1 according to the second preferred embodiment is manufactured, the diameter of an inner peripheral surface 310 of an auxiliary ring 31 similar to that shown in FIG. 5 is previously measured while the outer diameter of a substrate 9 is also previously measured in processing. The thermal processing apparatus 1 captures images of the auxiliary ring 31 with the two camera units 6 before receiving the substrate 9, so that an image processing circuit 65 (see FIG. 6) obtains two points, corresponding to the points 310a shown in FIG. 8, on an inner peripheral surface 310 of the auxiliary ring 31 similarly to that of the thermal processing apparatus 1 according to the first preferred embodiment, and a total control part 10 obtains the position of the center of the auxiliary ring 31 on the basis of the positions of the two points on the auxiliary ring 31 and the previously measured diameter of the inner peripheral surface 310 of the auxiliary ring 31. In other words, the total control part 10 substitutes the coordinates of the two points in an equation of a circle having the center coordinates of the auxiliary ring 31 as unknowns and solves the equation, thereby specifying the position of the center of the auxiliary ring 31 with respect to the central axis 1a, for example.

Also immediately after introduction of the substrate 9, the thermal processing apparatus 1 images an outer edge 91 of the substrate 9 with the two camera units 6 so that the image processing circuit 65 obtains the positions of two points, corresponding to the points 90a in FIG. 11, on the outer peripheral surface 90 of the substrate 9 and the total control part 10 obtains the position of the center of the substrate 9 on the basis of the positions of these points and the outer diameter of the substrate 9.

Thereafter the total control part 10 controls a transport robot 8 to match the centers of the substrate 9 and the auxiliary ring 31 with each other, similarly to the first preferred embodiment. Thus, the transport robot 8 places the substrate 9 on a prescribed position of the auxiliary ring 31, so that the thermal processing apparatus 1 thermally processes the substrate 9.

When the diameter of a specific portion such as the inner peripheral surface 310 of the auxiliary ring 31 and the outer diameter of the substrate 9 are known as described above, the thermal processing apparatus 1 can match the centers of the substrate 9 and the auxiliary ring 31 with each other and place the former on the latter also when the same is provided with only two camera units 6.

Alternatively, camera units provided outside the thermal processing apparatus 1 may measure the central position of the substrate 9, and it follows that the thermal processing apparatus 1 measures only the position of the center of the auxiliary ring 31 in this case.

Figure 13:
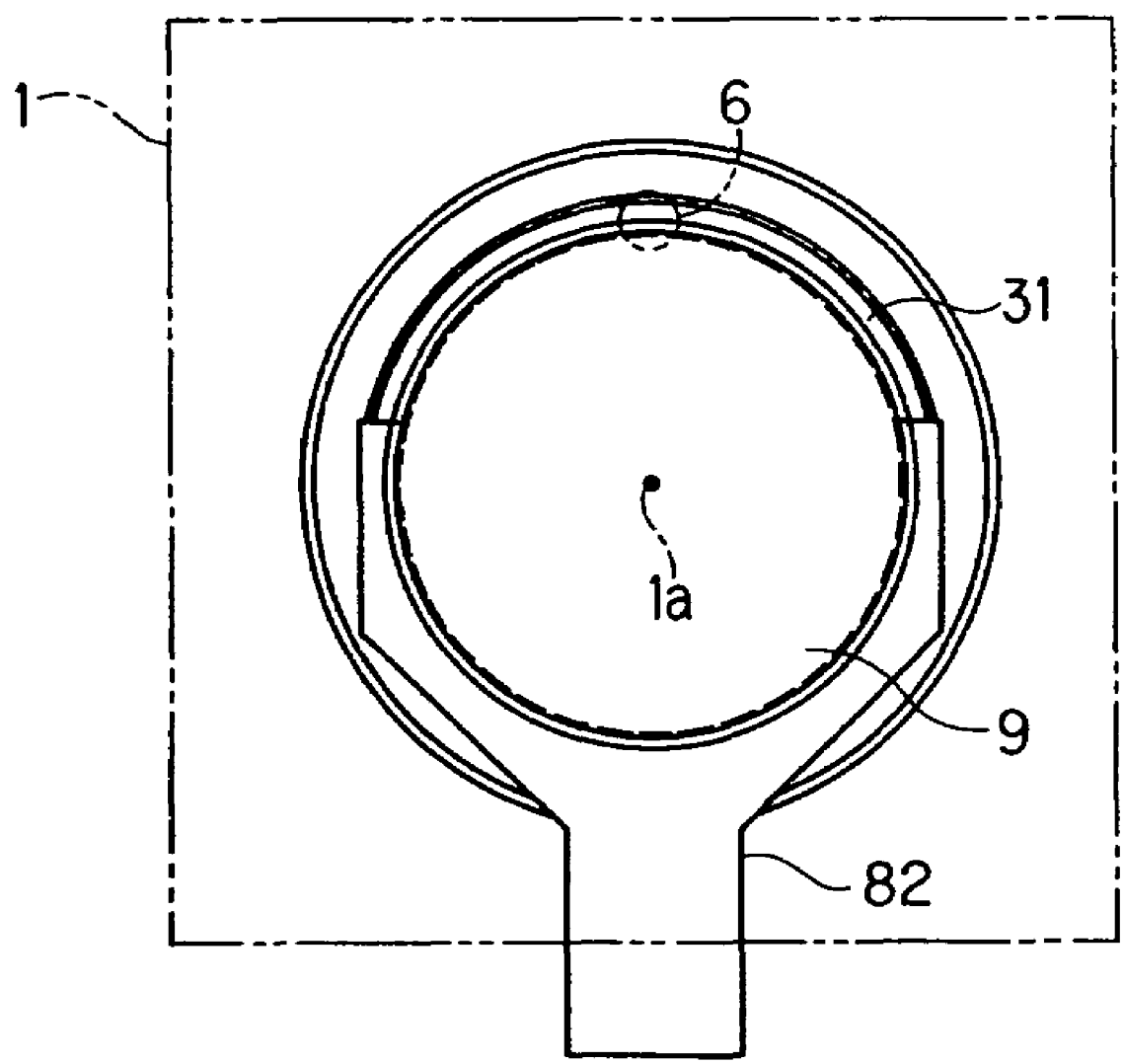
FIG. 13 is a plan view showing a thermal processing apparatus according to a third preferred embodiment of the present invention.

FIG. 13 illustrates a thermal processing apparatus 1 according to a third preferred embodiment of the present invention in a similar manner to FIG. 10. The thermal processing apparatus 1 according to the third preferred embodiment is similar to that according to the first preferred embodiment except that the same is provided with only one camera unit 6. With reference to the third embodiment, it is assumed that the position of the center of a substrate 9 is captured before the same is introduced into the thermal processing apparatus 1 and the diameter of an inner peripheral surface 310 of an auxiliary ring 31 similar to that shown in FIG. 5 is also previously captured.

Figure 14:
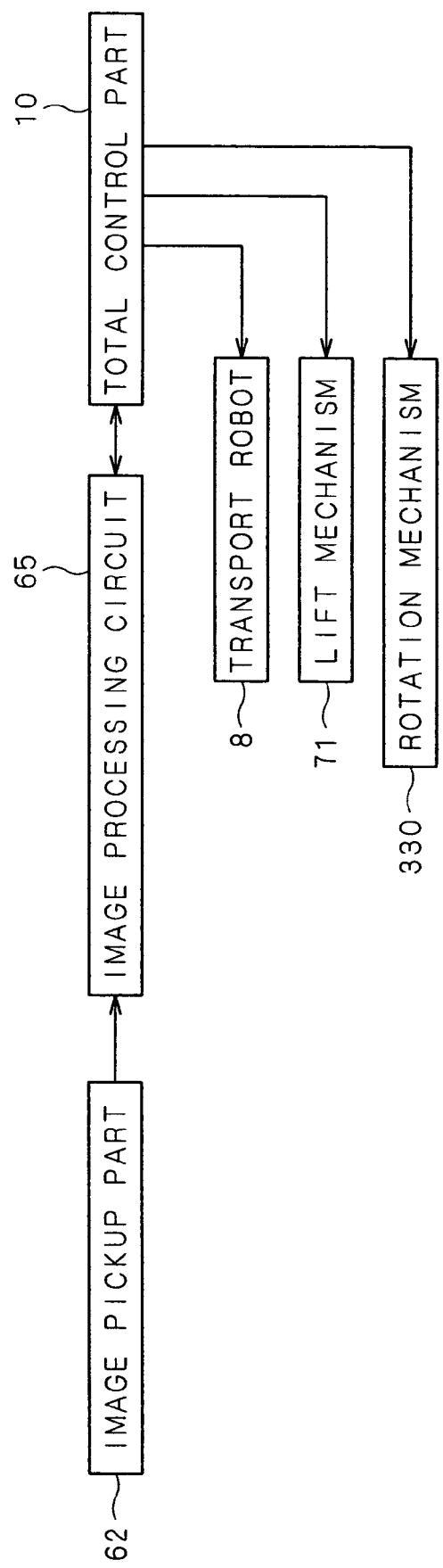
FIG. 14 is a block diagram showing the connectional relation between an image pickup part and the remaining structures of the thermal processing apparatus.
Figure 15:
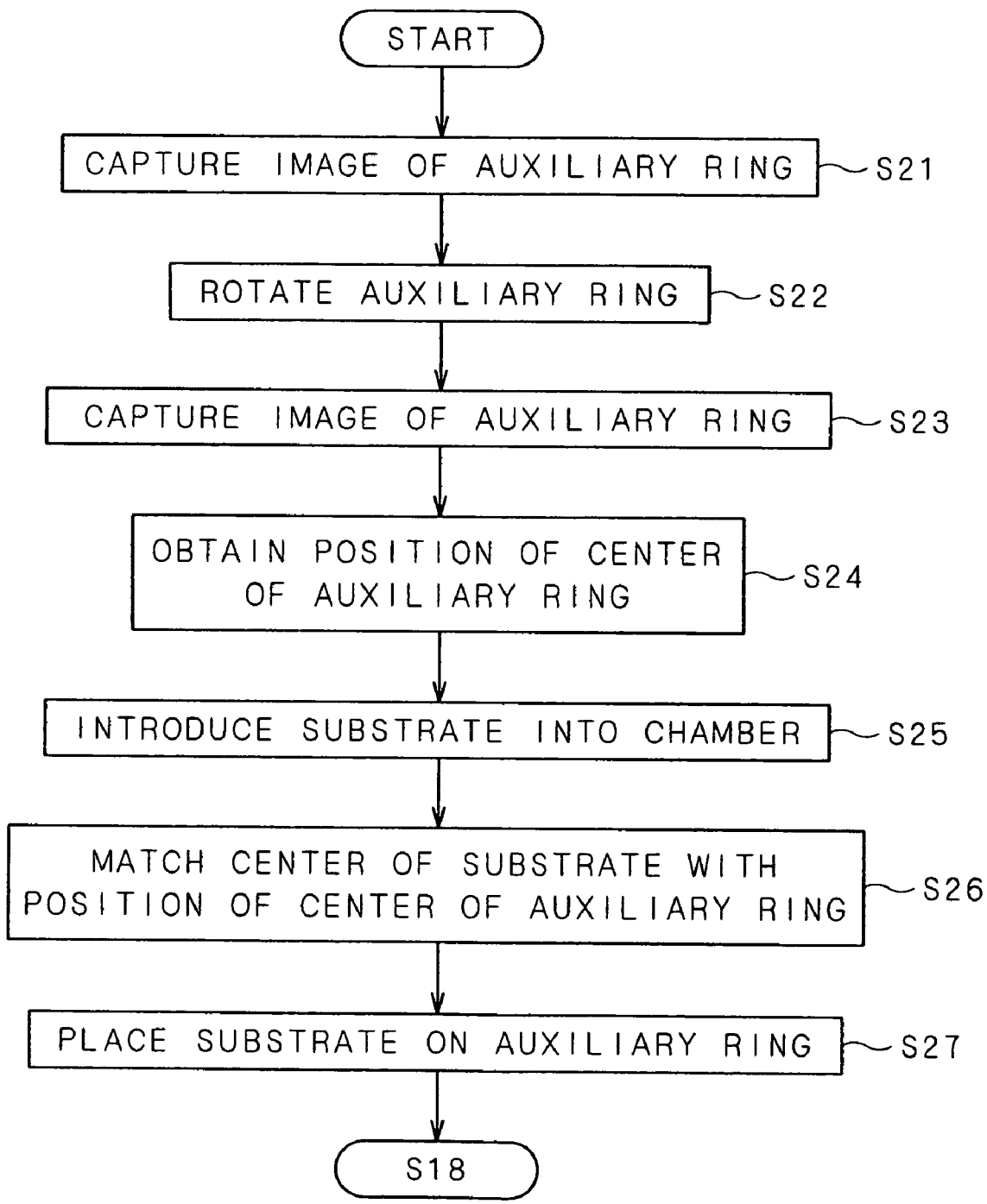
FIG. 15 illustrates the flow of operations of the thermal processing apparatus.

FIG. 14 is a block diagram showing the connectional relation between an image pickup part 62 of the camera unit 6 and the remaining structures of the thermal processing apparatus 1 according to the third preferred embodiment, and FIG. 15 illustrates the flow of operations of the thermal processing apparatus 1 receiving the substrate 9.

According to the third preferred embodiment, the thermal processing apparatus 1 inputs the image captured by the image pickup part 62 in an image processing circuit 65 (step S21), so that a total control part 10 thereafter controls a motor 333 similar to that shown in FIG. 3 and a rotation mechanism 330 formed by the motor 333 and coupling members 331 and 332 rotates the auxiliary ring 31 by 90°, for example (step S22). Then, the image pickup part 62 captures another image of the auxiliary ring 31 (step S23). Thus, it follows that the image processing circuit 65 receives images of two portions of the auxiliary ring 31.

The image processing circuit 65 obtains specific points (on the inner peripheral surface 310 similar to that shown in FIG. 5) in the two images. The total control part 10 obtains the position of the center of the auxiliary ring 31 on the basis of the positions of these points and the rotational angle of the auxiliary ring 31 (step S24). More specifically, the total control part 10 obtains the position of a specific point in the previously captured image after rotating the same about a central axis 1*a* and obtains a point separated from the obtained position and the position of a specific point in the subsequently captured image toward the central axis 1*a* by the radius of the inner peripheral surface 310 as the center of the auxiliary ring 31.

Thereafter the total control part 10 controls a transport robot 8 for introducing the substrate 9 into a chamber and matching the centers of the substrate 9 and the auxiliary ring 31 with each other, and lift pins 711 place the substrate 9 on the auxiliary ring 31 (steps S25 to S27; see FIG. 14). When the lift pins 711 completely place the substrate 9 on the auxiliary ring 31, the thermal processing apparatus 1 performs thermal processing on the substrate 9 through steps similar to those following the step S18 shown in FIG. 7.

When the diameter of the inner peripheral surface 310 of the auxiliary ring 31 is unknown, the thermal processing apparatus 1 can obtain the position of the center of the auxiliary ring 31 by further repeatedly rotating the auxiliary ring 31 and capturing images of at least three portions of the auxiliary ring 31.

As hereinabove described, the thermal processing apparatus 1 according to the third preferred embodiment matches the centers of the substrate 9 and the auxiliary ring 31 with each other with the single image pickup part 62.

Figure 16:
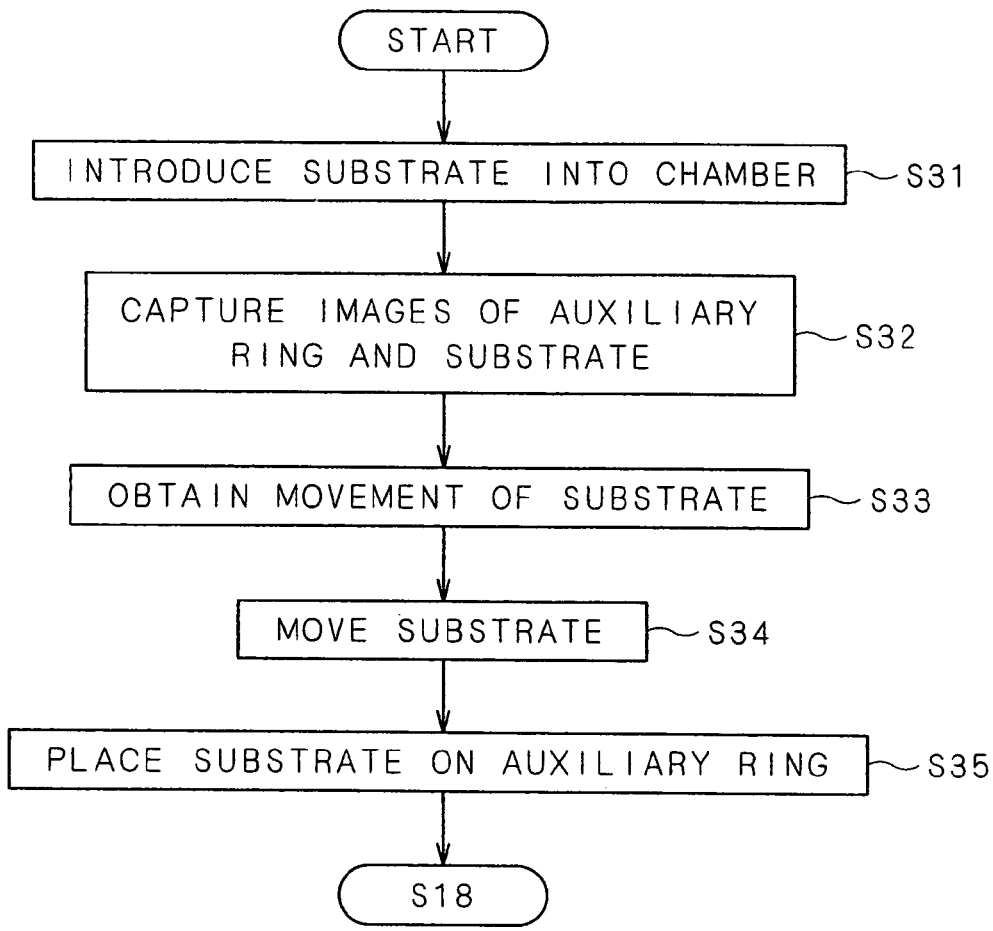
FIG. 16 illustrates the flow of operations of a thermal processing apparatus according to a fourth preferred embodiment of the present invention.

FIG. 16 illustrates the flow of operations of introducing a substrate 9 into a thermal processing apparatus 1 according to a fourth preferred embodiment of the present invention.

The thermal processing apparatus 1 according to the fourth preferred embodiment is similar in structure to the thermal processing apparatus 1 according to the second preferred embodiment, and provided with two camera units 6. It is assumed that the diameter of an inner peripheral surface 310 of an auxiliary ring 31 and the outer diameter of the substrate 9 are known also in the fourth preferred embodiment.

When the substrate 9 is introduced into the thermal processing apparatus 1 according to the fourth preferred embodiment (step S31), two image pickup parts 62 capture two images 606 (see FIG. 17) including both of the auxiliary ring 31 and an outer edge 91 of the substrate 9 (step S32).

Figure 17:
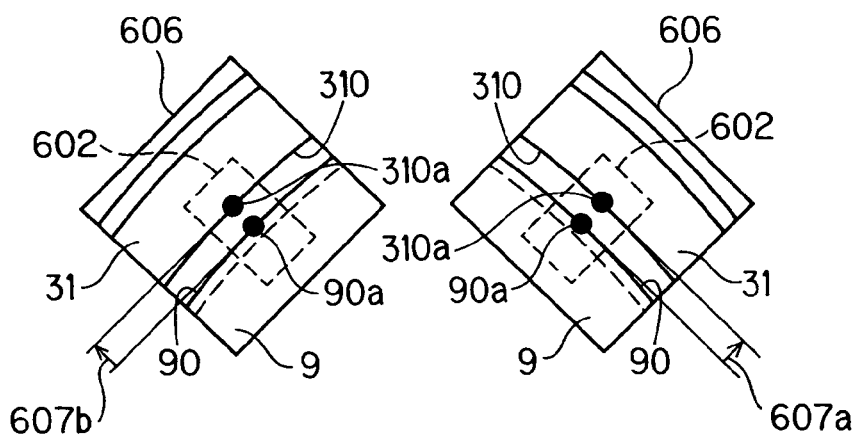
FIG. 17 illustrates images captured in image pickup parts.

FIG. 17 illustrates the two captured images 606. An image processing circuit 65, similar to that shown in FIG. 6 but provided with only two image pickup parts 62 in the fourth preferred embodiment, processes previously set processed areas 602 of the images 606 for obtaining points 310*a* on the inner peripheral surface 310 of the auxiliary ring 31 and points 90*a* on an outer peripheral surface 90 of the substrate 9. The image processing circuit 65 obtains these points 310*a* and 90*a* as those opposed to each other along a direction outward from a central axis 1*a* of the thermal processing apparatus 1. A total control part 10 obtains vectors 607*a* and 607*b*, starting from the substrate 9, between the points 310*a* and 90*a* of the two images 606.

Since the diameter of the inner peripheral surface 310 of the auxiliary ring 31 and the outer diameter of the substrate 9 are known, the total control part 10 previously obtains the ideal distance between the inner peripheral surface 310 and the outer peripheral surface 90 for matching the centers of the substrate 9 and the auxiliary ring 31 with each other. Therefore, the total control part 10 obtains the movement of the substrate 9 for setting the vectors 607*a* and 607*b* to ideal lengths (step S33).

Figure 18:
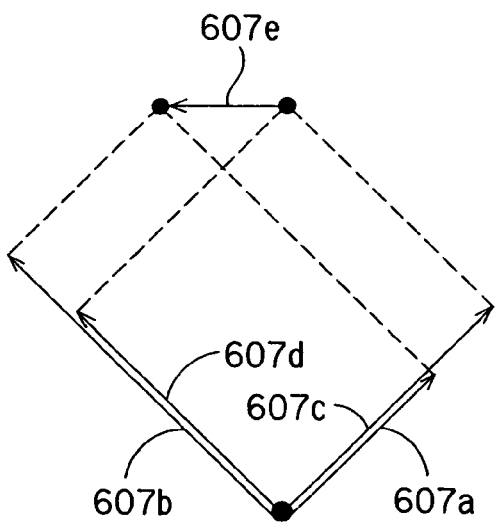
FIG. 18 is a diagram for illustrating a method of obtaining movement of a substrate.

FIG. 18 is a diagram for illustrating a method of obtaining the movement of the substrate 9. When obtaining the vectors 607*a* and 607*b* from the two images 606, the total control part 10 matches the starting points of these vectors 607*a* and 607*b* with each other and further sets vectors 607*c* and 607*d* having the same directions as the vectors 607*a* and 607*b* and previously obtained ideal lengths. The total control part 10 obtains a vector 607*e* from the sum of the vectors 607*c* and 607*d* toward the sum of the vectors 607*a* and 607*b* as the movement.

The total control part 10 controls a transport robot 8 to move the center of the substrate 9 by the vector 607*e* (step S34), and sets the distance between the points 310*a* and 90*a* shown in FIG. 17 as the ideal distance. Thereafter the transport robot 8 places the substrate 9 on the auxiliary ring 31 while matching the centers thereof with each other (step S35).

As hereinabove described, the thermal processing apparatus 1 according to the fourth preferred embodiment simultaneously captures images of the outer edge 91 of the substrate 9 and the auxiliary ring 31 with the two image pickup parts 62 and positions the substrate 9 and the auxiliary ring 31 through the previously obtained distance between the inner peripheral surface 310 of the auxiliary ring 31 and the outer peripheral surface 90 of the substrate 9.

Figure 19:
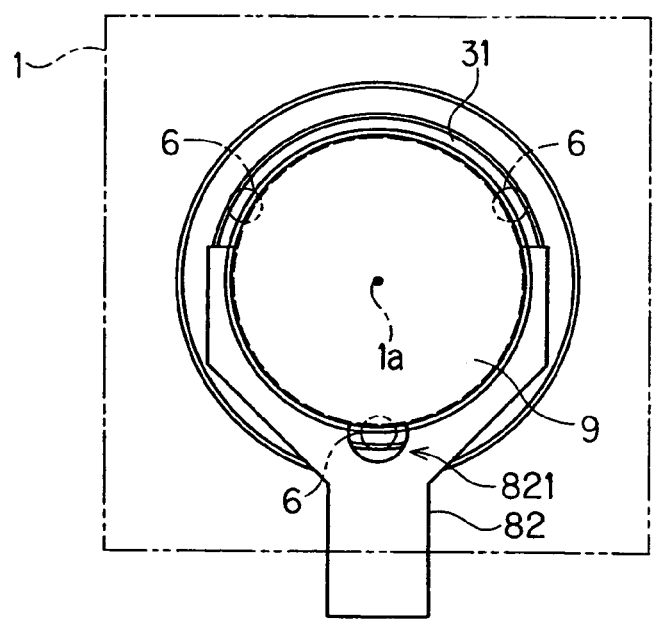
FIG. 19 is a plan view showing a thermal processing apparatus according to a fifth preferred embodiment of the present invention.

FIG. 19 illustrates a thermal processing apparatus 1 according to a fifth preferred embodiment of the present invention in a similar manner to FIG. 10. The thermal processing apparatus 1, similar in structure to that according to the first preferred embodiment, is provided with three camera units 6. An arm 82 of a transport robot 8 is provided with a notch 821, not to hinder the camera units 6 from picking up images.

Also in the thermal processing apparatus 1 according to the fifth preferred embodiment, image pickup parts 62 of the camera units 6 capture images of a substrate 9 introduced into the thermal processing apparatus 1. Thus, the camera units 6 capture three images equivalent to the images 606 illustrated in FIG. 17. The thermal processing apparatus 1 obtains vectors 608*a*, 608*b* and 608*c* reaching points 310*a* on an inner peripheral surface 310 of an auxiliary ring 31 from points 90*a* of an outer peripheral surface 90 of the substrate 9 in the respective images similar to the images 606, similarly to the thermal processing apparatus 1 according to the fourth preferred embodiment.

Figure 20:
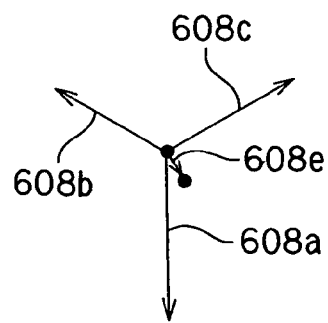
FIG. 20 is a diagram for illustrating a method of obtaining movement of a substrate.

FIG. 20 illustrates matched starting points of the obtained three vectors 608*a*, 608*b* and 608*c*. A total control part 10 obtains an average vector 608*e* of the three vectors 608*a*, 608*b* and 608*c* as the movement of the substrate 9. The thermal processing apparatus 1 moves the substrate 9 by the average vector 608*e*, thereby substantially matching the centers of the substrate 9 and the auxiliary ring 31 with each other, i.e., substantially equalizes the lengths of the three vectors 608*a*, 608*b* and 608*c* with each other after the movement.

While the centers of the substrate 9 and the auxiliary ring 31 do not coincide with each other in a strict sense when the thermal processing apparatus 1 moves the substrate 9 by the average vector 608*e*, the center of the substrate 9 introduced into the thermal processing apparatus 1 is approximate to that of the auxiliary ring 31 and the three camera units 6 are uniformly arranged every 120° about a central axis 1*a* as shown in FIG. 19, and hence the thermal processing apparatus 1 can sufficiently approach the center of the substrate 9 to that of the auxiliary ring 31 by moving the substrate 9 by the average vector 608*e*. The total control part 10 may alternatively obtain the movement by another method of obtaining a vector toward the circumcenter of a triangle formed by the points of the three vectors 608*a*, 608*b* and 608*c*, for example.

The thermal processing apparatus 1 according to the fifth preferred embodiment can render the distance between the inner peripheral surface 310 of the auxiliary ring 31 and the outer peripheral surface 90 of the substrate 9 constant by simultaneously capturing images of the outer edge 91 of the substrate 9 and the auxiliary ring 31 with the three image pickup parts 62 also when the diameter of the inner peripheral surface 310 of the auxiliary ring 31 or the outer diameter of the substrate 9 is unknown. Consequently, the thermal processing apparatus 1 can match the centers of the substrate 9 and the auxiliary ring 31 with each other.

Figure 21:
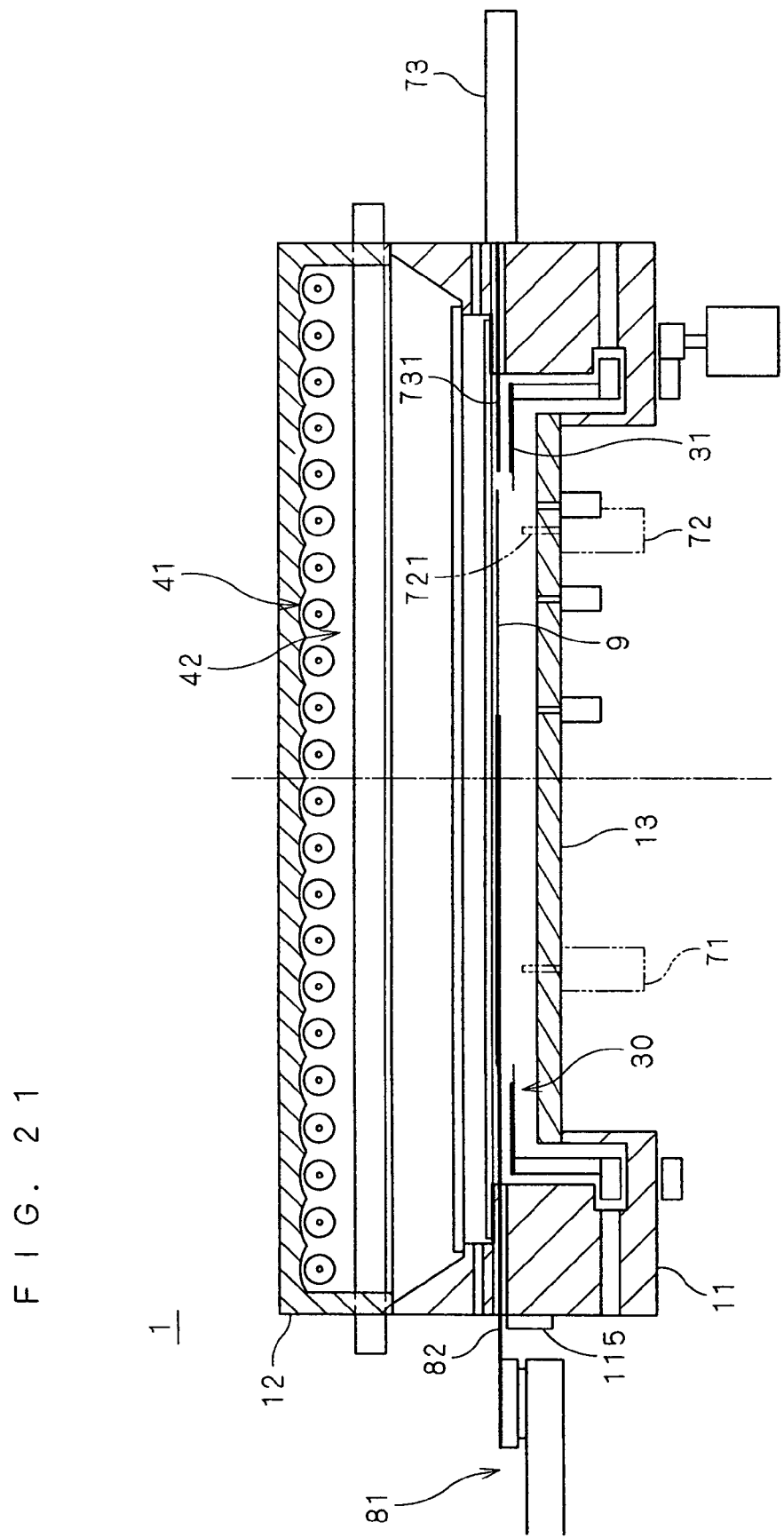
FIG. 21 is a longitudinal sectional view showing a thermal processing apparatus according to a sixth preferred embodiment of the present invention.
Figure 22:
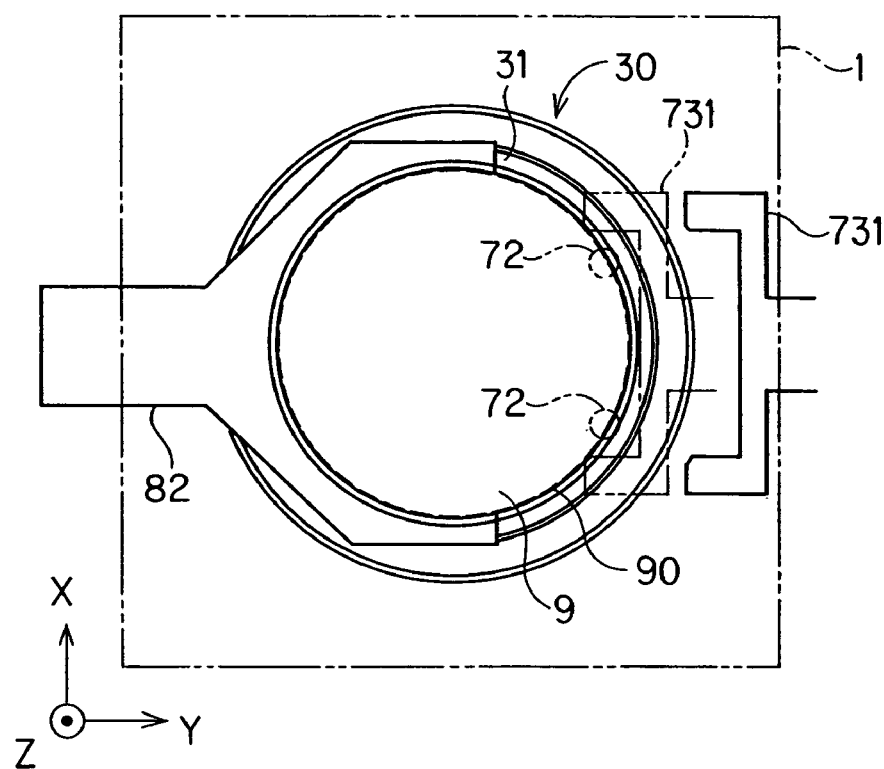
FIG. 22 is a plan view showing the thermal processing apparatus.

FIG. 21 is a longitudinal sectional view showing a thermal processing apparatus 1 according to a sixth preferred embodiment of the present invention, and FIG. 22 is a plan view showing a portion around a support ring group 30. FIGS. 21 and 22 show the thermal processing apparatus 1 immediately after receiving a substrate 9 introduced into the same with an arm 82.

The thermal processing apparatus 1 according to the sixth preferred embodiment is similar in structure to the thermal processing apparatus 1 according to the first preferred embodiment except that camera units 6 are omitted. Two pin hoisting mechanisms 72 are provided for reciprocating positioning pins 721 with respect to an auxiliary ring 31 from the lower surface of a reflector 13, while a plate moving mechanism 73 is provided on a side portion, opposite to a gate 115, of a body part 11 for horizontally reciprocating a positioning plate 731 with respect to a substrate 9 with an air cylinder. The remaining structure of the thermal processing apparatus 1 according to the sixth preferred embodiment is similar to that of the thermal processing apparatus 1 according to the first preferred embodiment, and portions similar to those in the first preferred embodiment are properly denoted by the same reference numerals.

Figure 23:
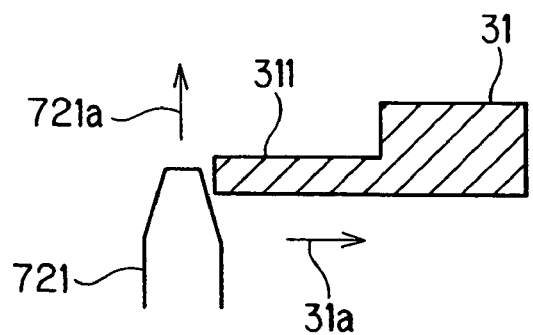
FIG. 23 illustrates a positioned auxiliary ring.

The thermal processing apparatus 1 according to the sixth preferred embodiment first positions the auxiliary ring 31 with the pin hoisting mechanisms 72 before receiving the substrate 9. FIG. 23 illustrates the positioned auxiliary ring 31. The auxiliary ring 31 is placed on a cushion ring 32 in a slightly movable state as described with reference to the first preferred embodiment, and the cushion ring 32 is placed on a cylindrical member 33 also in a slightly movable state (see FIG. 5). In the thermal processing apparatus 1, each pin hoisting mechanism 72 moves up the positioning pin 721 having a tapered forward end along arrow 721*a* thereby bringing the positioning pin 721 into contact with the forward end of a support part 311 for the auxiliary ring 31 and horizontally sliding the auxiliary ring 31 along arrow 31*a*.

As shown in FIG. 22, the positioning pins 721 of the two pin hoisting mechanisms 72 urge the auxiliary ring 31 thereby moving the same in a direction Y in FIG. 22. Thus, it follows that the support ring group 30 moves to a constant position deviating to a direction (+Y) for locating the auxiliary ring 31 on a prescribed position.

When the arm 82 introduces the substrate 9 into the thermal processing apparatus 1, the plate moving mechanism 73 moves a positioning plate 731 toward the substrate 9 so that two portions of the forward end of the positioning plate 731 come into contact with an outer peripheral surface 90 of the substrate 9. Thus, it follows that the substrate 9 slightly moves in a direction (–Y) and is located on a prescribed position where the center thereof coincides with that of the positioned auxiliary ring 31.

Thereafter a lift mechanism 71 raises the substrate 9, the arm 82 retreats and the lift mechanism 71 moves down the substrate 9, thereby placing the substrate 9 on the auxiliary ring 31 in the positioned state.

The thermal processing apparatus 1 according to the sixth preferred embodiment mechanically positions the auxiliary ring 31 and the substrate 9 for rendering overlaps thereof constant.

When completely thermally processing the substrate 9, the thermal processing apparatus 1 stops rotating the auxiliary ring 31 at an angle of 180° with respect to that when receiving the substrate 9. Thus, it follows that the auxiliary ring 31 is located on a position deviating toward the direction (–Y) and the positioning pins 721 properly position the auxiliary ring 31 before the same receives a subsequent substrate 9 thereon.

As hereinabove described, each of the thermal processing apparatuses 1 according to the second to sixth preferred embodiments also correctly positions the substrate 9 with respect to the auxiliary ring 31 before receiving the substrate 9 similarly to the first preferred embodiment, whereby the thermal processing apparatus 1 can render overlaps of the outer edge 91 of the substrate 9 and the auxiliary ring 31 constant and design the shape of the auxiliary ring 31 to sufficiently reduce the overlaps, suppress (pseudo) thermal capacity of the outer edge 91 and suppress dispersion of the thermal capacity. Consequently, the thermal processing apparatus 1 can improve temperature uniformity of the overall substrate 9 and implement proper thermal processing on the substrate 9.

Each of the thermal processing apparatuses 1 according to the first, second, fourth and fifth preferred embodiments picks up images before receiving the substrate 9, for implementing proper placing even if the introduced substrate 9 slightly moves on the arm 82. Further, each of the thermal processing apparatuses 1 according to the fourth and fifth preferred embodiments, positioning the substrate 9 and the auxiliary ring 31 on the basis of the distance between the outer peripheral surface 90 of the former and the inner peripheral surface 310 of the latter, can position the substrate 9 and the auxiliary ring 31 also when mounting positions of the camera units 6 are unknown.

While the support ring group 30 supports the substrate 9 in each of the thermal processing apparatuses 1 according to the aforementioned preferred embodiments, the cushion ring 32 may alternatively be omitted while leaving the auxiliary ring 31. The auxiliary ring 31 is not restricted to that having a step but may alternatively be a flat annular plate. Further, the auxiliary ring 31 may not support the substrate 9 but the substrate 9 may be separately supported so that the annular auxiliary ring 31 is arranged around the outer edge 91 of the substrate 9 at a prescribed interval. Also in this case, the thermal processing apparatus 1 can improve performance of uniformly heating the overall substrate 9 by correctly positioning the substrate 9 with respect to the auxiliary ring 31 and rendering the distance between the outer peripheral surface 90 of the substrate 9 and the auxiliary ring 31 constant.

Each of the thermal processing apparatuses 1 according to the aforementioned preferred embodiments may alternatively measure a portion other than the inner peripheral surface 310 of the auxiliary ring 31. For example, the thermal processing apparatus 1 may detect the innermost edge of the auxiliary ring 31 (the forward end of the support part 311) or the outermost edge thereof. Further, a mark for positional detection such as a mark-off line, for example, may be provided on the auxiliary ring 31.

The thermal processing apparatus 1 may illuminate the camera units 6 by weakly lighting a thermal processing lamp or inserting a fluorescent tube from the lid part 12. The opening 120 for imaging, preferably formed on a wall surface of a lamp side with respect to the substrate 9 so that the same is not exposed to processing gas in the chamber formed by the body part 11 and the lid part 12, can alternatively be formed on the side of the reflector 13 through a necessary countermeasure.

The number of the camera units 6 may exceed that shown in each of the preferred embodiments. In other words, the thermal processing apparatus 1 can obtain the position of the center of the auxiliary ring 31 by capturing at least two portions of the auxiliary ring 31 with at least one image pickup part 62, and can obtain the positions of the centers of the auxiliary ring 31 and the substrate 9 by including at least two image pickup parts 62.

The mechanism of mechanically positioning the substrate 9 and the auxiliary ring 31 in the aforementioned sixth preferred embodiment is a mere example, and may be replaced with another mechanism.

The lamps for irradiating the substrate 9 with light may not necessarily be provided as the upper and lower lamp groups 41 and 42 perpendicular to each other but the thermal processing apparatus 1 may be provided with only either the upper or lower lamp group 41 or 42. Further, the thermal processing apparatus 1 may alternatively irradiate the substrate 9 with light from the upper and lower surfaces thereof.

The substrate 9 processed by the thermal processing apparatus 1 is not restricted to a semiconductor substrate but the substrate processing apparatus 1 can also be utilized for thermally processing a glass substrate for a flat panel display such as a liquid crystal display or a plasma display.

Figure 24:
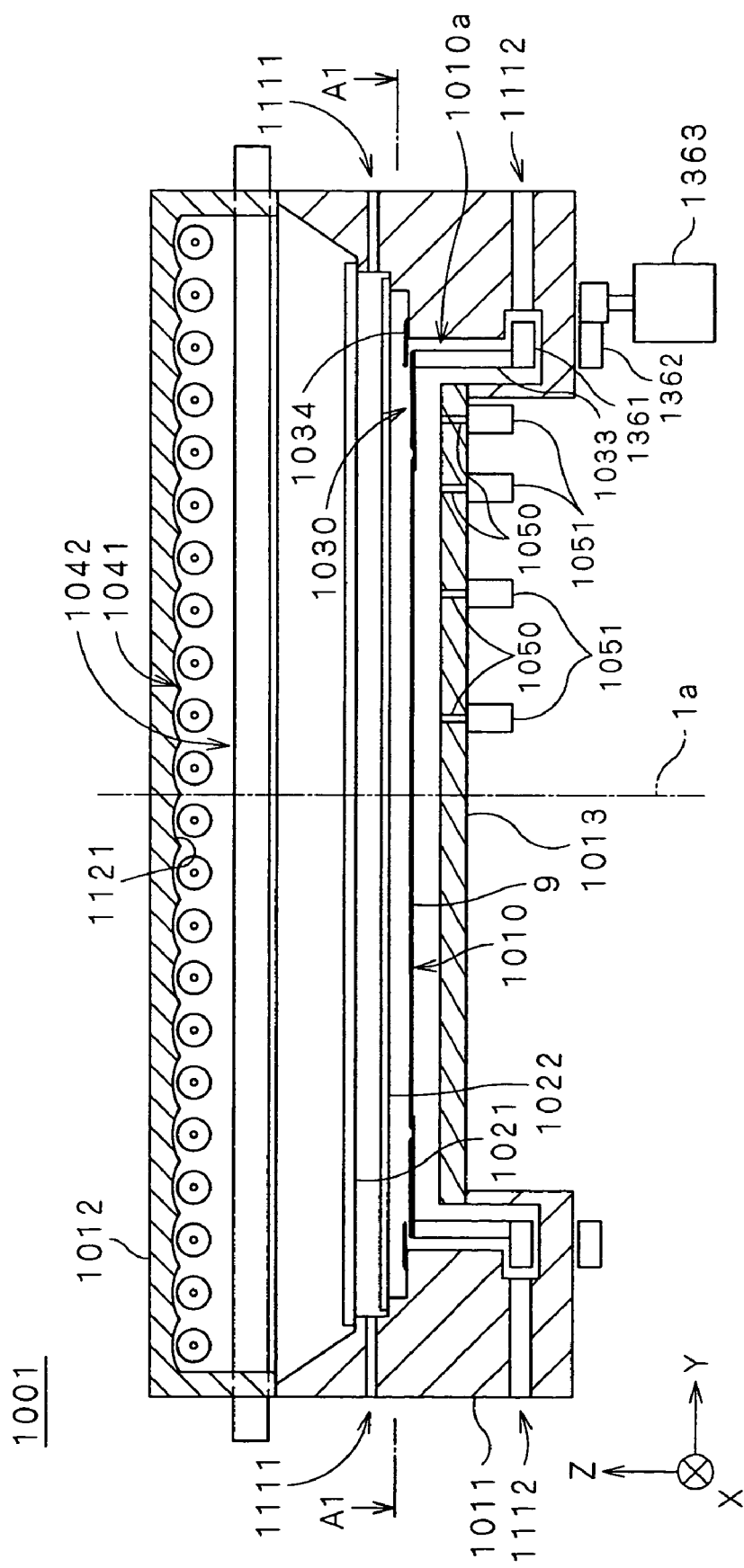
FIG. 24 is a longitudinal sectional view showing a thermal processing apparatus according to a seventh preferred embodiment of the present invention.

FIG. 24 is a longitudinal sectional view showing the structure of a thermal processing apparatus 1001 according to a seventh preferred embodiment of the present invention. FIG. 24 omits parallel oblique lines with respect to sections of details.

The thermal processing apparatus 1001 irradiates a substrate 9 with light in a prescribed atmosphere thereby performing various processing such as oxidization, annealing and CVD accompanied by heating on the substrate 9. In the thermal processing apparatus 1001, a body part 1011 forming the apparatus body, a lid part 1012 covering the upper portion of the body part 1011 and a reflector 1013 arranged on the central bottom surface of the body part 1011 form a chamber. A chamber window 1021 of quartz vertically partitions the internal space of the chamber, and an auxiliary ring group 1030 supports the substrate 9 in a lower processing space 1010. An O-ring (not shown) seals the clearance between the chamber window 1021 and the body part 1011, which has a cylindrical inner side surface.

A plurality of gas inlets 1111 and a plurality of outlets 1112 are formed on the side wall of the body part 1011. The processing space 1010 performs gas replacement by (enforcedly) discharging gas from the outlets 1112 while introducing gas (e.g., nitrogen, oxygen or the like) responsive to the type of processing performed on the substrate 9 through the gas inlets 1111. The thermal processing apparatus 1001 is provided with a shower plate 1022 of quartz formed with a large number of holes between the substrate 9 and the chamber window 1021, for homogeneously supplying the gas introduced from the gas inlets 1111 to the upper surface of the substrate 9 through the shower plate 1022. The gas employed for the processing is guided to the outlets 1112 from below the processing space 1010.

A cylindrical member 1033 centered at a central axis 1a of the apparatus 1001 supports the auxiliary ring group 1030, while a coupling member 1361 is mounted on the lower end of the cylindrical member 1033. Another coupling member 1362 opposed to the coupling member 1361 is provided under the body part 1011 so that the coupling members 1361 and 1362 form a magnetic coupling mechanism. The coupling member 1362 rotates about the central axis 1a through a motor 1363. Thus, the coupling member 1361 provided in the body part 1011 rotates due to magnetic action, while the substrate 9 and the auxiliary ring group 1030 rotate about the central axis 1a while keeping the direction of the main surface constant. The cylindrical member 1033 is made of quartz, in order to suppress thermal expansion in heating.

An annular screening ring 1034 is provided outside the auxiliary ring group 1030. The body part 1011 supports the screening ring 1034, which in turn covers the outer side of the auxiliary ring group 1030 and a clearance 1010a between the cylindrical member 1033 and the body part 1011.

The lower surface of the lid part 1012 of the thermal processing apparatus 1001 defines a reflecting surface (hereinafter referred to as "reflector") 1121 opposed to the upper surface of the substrate 9, and a bar-shaped upper lamp group 1041 is arranged along the reflector 1121 so that respective lamps are along a direction X. The reflector 1121 reflects a component of light upwardly emitted from the upper lamp group 1041 and applies the same to the substrate 9. The upper lamp group 1041 is formed by infrared halogen lamps, for example. A bar-shaped lower lamp group 1042 is arranged under the upper lamp group 1041, i.e., between the upper lamp group 1041 and the substrate 9, so that respective lamps are along a direction Y perpendicularly to the upper lamp group 1041.

Each of the upper and lower lamp groups 1041 and 1042 is divided into small groups in response to distances from the central axis 1*a*, and the groups are individually connected to a lamp control part and supplied with power independently of each other.

A plurality of radiation thermometers 1051 are mounted under the substrate 9 outwardly from the central axis 1*a*. The radiation thermometers 1051 receive infrared light from the substrate 9 through a window member 1050 provided on the reflector 1013 thereby measuring the temperature of the substrate 9. The plurality of radiation thermometers 1051 measure the temperature of the substrate 9 placed on the auxiliary ring group 1030 and rotated in response to distances from the central axis 1*a*. The thermal processing apparatus 1001 controls the lamps so that the temperature of the substrate 9 is as uniform as possible according to the results of measurement. At this time, the substrate 9, the auxiliary ring group 1030 and the screening ring 1034 inhibit light from the lamp groups 1041 and 1042 from entering the radiation thermometers 1051, so that the radiation thermometers 1051 correctly measure the temperature.

Figure 25:
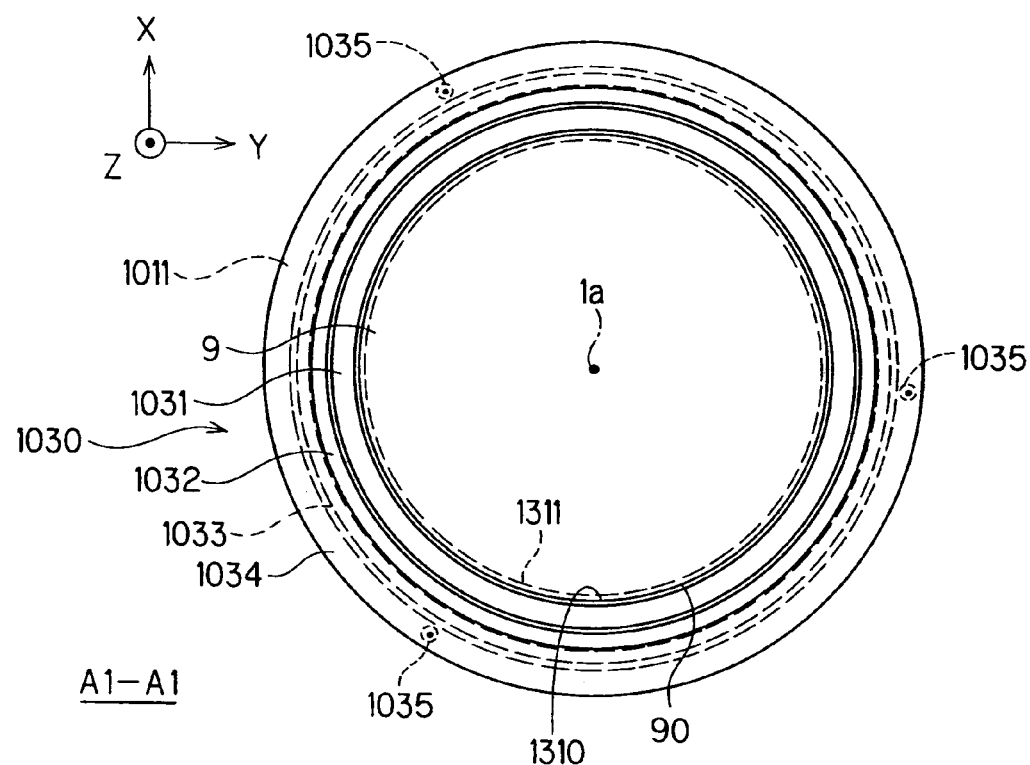
FIG. 25 is a plan view showing the inside of a screening ring.
Figure 26:
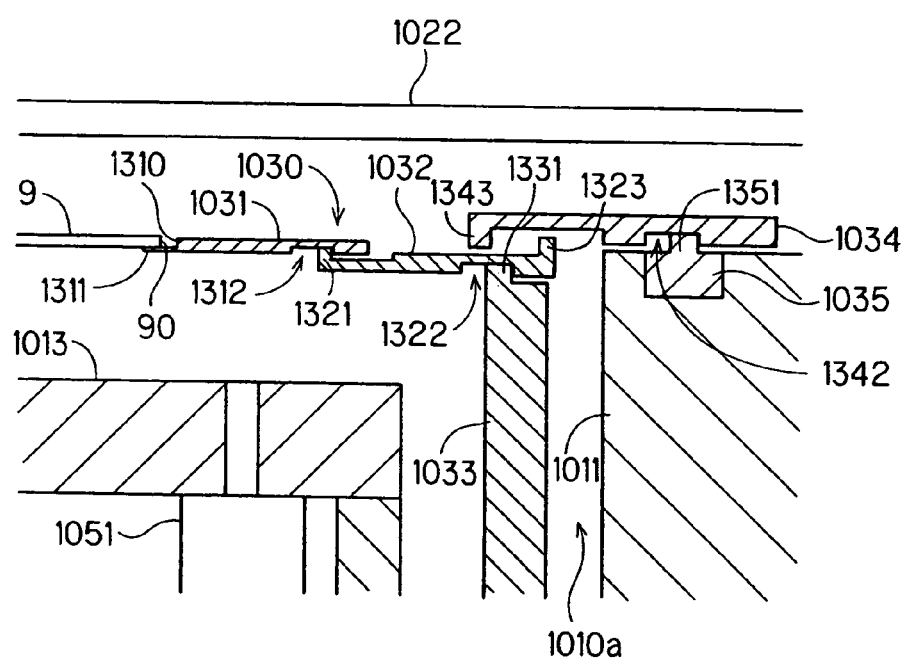
FIG. 26 is an enlarged sectional view showing an auxiliary ring group supporting a substrate.

FIG. 25 illustrates the inside of the screening ring 1034 along arrows A1 in FIG. 24, and FIG. 26 is an enlarged sectional view of the auxiliary ring group 1030 supporting the substrate 9.

As shown in FIGS. 25 and 26, the auxiliary ring group 1030 is formed by first and second annular auxiliary rings 1031 and 1032 spreading along the outer periphery of the substrate 9, so that the first auxiliary ring 1031 receives the substrate 9 thereon and the second auxiliary ring 1032 supports the first auxiliary ring 1031 from outside. Both of the first and second auxiliary rings 1031 and 1032 are made of silicon carbide (SiC) having specific heat capacity close to that of the substrate 9, and provided in the form of tori centered at the central axis 1*a*. The first and second auxiliary rings 1031 and 1032 are heated integrally with the substrate 9, thereby improving in-plane uniformity of the temperature of the substrate 9.

The first auxiliary ring 1031 has an annular support part 1311 projecting toward the central axis 1*a* on its inner peripheral surface 1310. The support part 1311 comes into contact with the outer edge of the substrate 9, transported into the processing space 1010 by an external transport mechanism, from below thereby supporting the substrate 9. When the substrate 9 is placed on the first auxiliary ring 1031, an outer peripheral surface 90 of the substrate 9 and an inner peripheral surface 1310 of the first auxiliary ring 1031 are opposed to each other.

As shown in FIG. 26, annular concave portions 1312 and 1322 centered at the central axis 1*a* are formed on the lower surfaces of the first and second auxiliary rings 1031 and 1032 respectively, while a convex portion 1321 centered at the central axis 1*a* is provided on an inner end of the second auxiliary ring 1032 to annularly project upward. The upper surface of the convex portion 1321 comes into contact with the bottom surface (the downwardly directed surface) of the concave portion 1312 of the first auxiliary ring 1031 so that the second auxiliary ring 1032 supports the first auxiliary ring 1031. Another convex portion 1331 centered at the central axis 1*a* is annularly provided also on the upper surface of the cylindrical member 1033 of quartz to project upward and the upper surface of this concave portion 1331 comes into contact with the bottom surface of the concave portion 1322 of the second auxiliary ring 1032, so that the cylindrical member 1033 supports the second auxiliary ring 1032.

The first and second auxiliary rings 1031 and 1032 and the cylindrical member 1033 are provided in the form of rings while the support part 1311, the concave portions 1312 and 1322 and the convex portions 1321 and 1331 are annularly shaped thereby inhibiting processing gas from reaching the lower surface of the substrate 9.

The screening ring 1034 is made of silicon carbide, and provided to spread along the outer periphery of the substrate 9 while covering the outer side of the second auxiliary ring 1032, as shown in FIGS. 25 and 26. As shown in FIG. 26, an annular concave portion 1342 centered at the central axis 1*a* is formed on the lower surface of the screening ring 1034, and a plurality of support parts 1035 of quartz are fixed to the body part 1011 on a circumference centered at the central axis 1*a* (see FIG. 25). An upwardly projecting support pin 1351 is formed on the upper surface of the support part 1035 so that the upper surface of the support pin 1351 comes into contact with the bottom surface of the concave portion 1342 of the screening ring 1034 thereby supporting the screening ring 1034. The body part 1011 is made of SUS and cooled by a water-cooling mechanism (not shown).

A downwardly projecting annular projection 1343 is provided on an end of the screening ring 1034 closer to the central axis 1*a*, while an upwardly projecting annular projection 1323 is formed on an outer end of the second auxiliary ring 1032. The projections 1323 and 1343 form an optical labyrinth, for preventing light from entering a clearance 1010*a* between the body part 1011 and the cylindrical member 1033.

Figure 27:
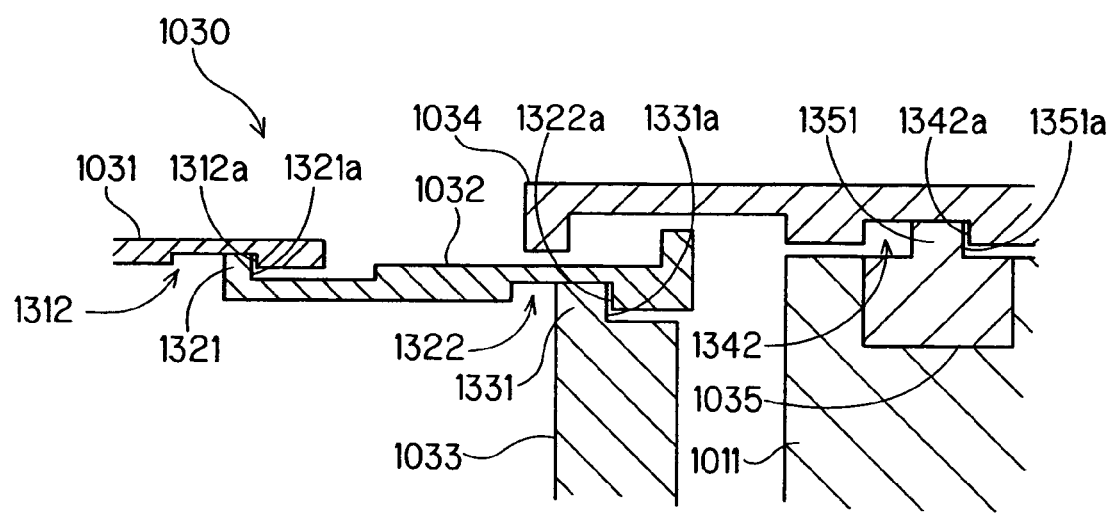
FIG. 27 is an enlarged sectional view showing the auxiliary ring group and the screening ring.

FIG. 27 illustrates the auxiliary ring group 1030 and the screening ring 1034 in an enlarged manner. When the thermal processing apparatus 1001 does not heat the substrate 9, a cylindrical surface 1312*a*, centered at the central axis 1*a*, of the concave portion 1312 of the first auxiliary ring 1031 directed toward the substrate 9 and an outwardly directed cylindrical surface 1321*a* of the convex portion 1321 of the second auxiliary ring 1032 are opposed to each other and approximately positioned (including a state of coming into contact with each other on any position; this also applies to the following description) as shown in FIG. 27. Similarly, a cylindrical surface 1322*a* of the concave portion 1322 of the second auxiliary ring 1032 directed toward the substrate 9 and an outwardly directed cylindrical surface 1331*a* of the convex portion 1331 of the cylindrical member 1033 are opposed to each other and approximately positioned. Further, a cylindrical surface 1342*a* of the concave portion 1342 of the screening ring 1034 directed toward the substrate 9 and an outwardly directed surface 1351*a*, i.e., the outer portion of the side surface, of the support pin 1351 of the support part 1035 are opposed to each other and approximately positioned.

Figure 28:
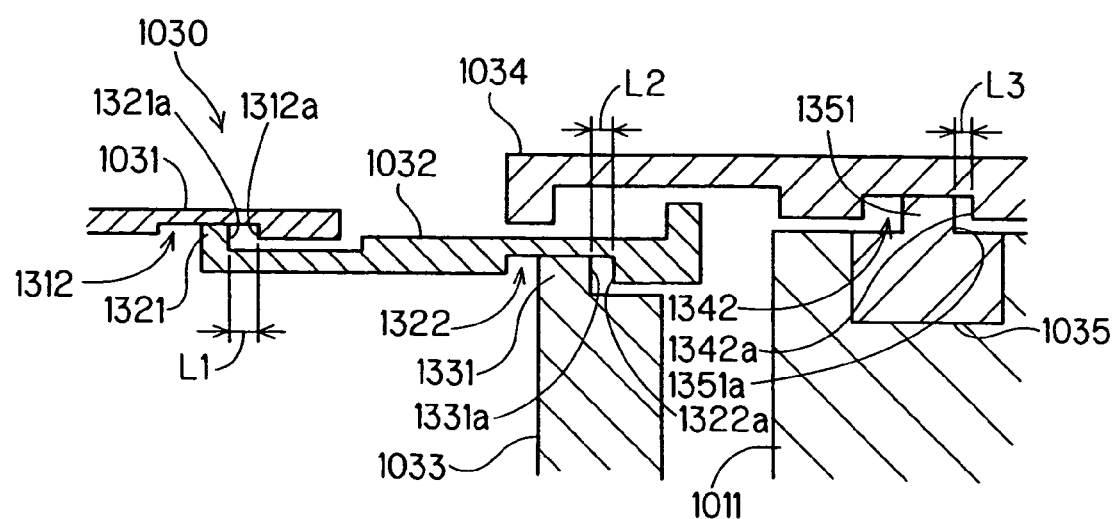
FIG. 28 is an enlarged sectional view showing the auxiliary ring group and the screening ring in heating.

FIG. 28 illustrates the auxiliary ring group 1030 and the screening ring 1034 of the thermal processing apparatus 1001 heating the substrate 9. While the thermal processing apparatus 1001 heats the first and second auxiliary rings 1031 and 1032 integrally with the substrate 9, the temperature is reduced outwardly from the substrate 9 and hence the temperature of the first auxiliary ring 1031 is higher than that of the second auxiliary ring 1032. Therefore, the length of the first auxiliary ring 1031 extended by expansion (i.e., change of the radius about the central axis 1*a*) is larger than that of the second auxiliary ring 1032 extended by expansion. Thus, the clearance, having a width L1 in FIG. 28, between the cylindrical surfaces 1312*a* and 1321*a* of the concave portion 1312 and the convex portion 1321 of the first and second auxiliary rings 1031 and 1032 is increased.

The second auxiliary ring 1032 is made of silicon carbide and the cylindrical member 1033 is made of quartz as hereinabove described while the thermal expansion coefficient of silicon carbide is larger than that of quartz by about one place, and hence the clearance, having a width L2 in FIG. 28, between the cylindrical surfaces 1322a and 1331a of the concave portion 1322 and the convex portion 1331 of the second auxiliary ring 1032 and the cylindrical member 1033 is increased when the thermal processing apparatus 1001 heats the substrate 9. Further, the support part 1035 is mounted on the body part 1011 cooled to less than 100° C., and hence the clearance, having a width L3 in FIG. 28, between the cylindrical surface 1342a of the concave portion 1342 of the screening ring 1034 and the surface 1351a of the support pin 1351 of the support part 1035 is increased when the thermal processing apparatus 1001 heats the screening ring 1034.

More specifically, the clearances between the concave portions 1312, 1322 and 1342 and the convex portions 1321 and 1331 and the support pin 1351 are set to 0.1 mm in the state shown in FIG. 27 when the diameter of the substrate 9 processed by thermal processing apparatus 1001 is 300 mm. The diameters of the auxiliary ring group 1030 and the screening ring 1034 are increased by about 1.5 mm when heated to 1100 to 1200° C., and hence the radial widths of the concave portions 1312, 1322 and 1342 are set larger than the widths of the convex portions 1321 and 1331 and the support pin 1351 by about 1 mm. In other words, slacks of about 1 mm are provided. Thus, the thermal processing apparatus 1001 can prevent cracking resulting from excess stress also when the first and second auxiliary rings 1031 and 1032 and the screening ring 1034 are expanded by heating.

The support pin 1351 supports the screening ring 1034, thereby preventing the clearance between the outer side of the screening ring 1034 and the body part 1011 from storing gas. The support pin 1351 may alternatively be replaced with an annular recessed member centered at the central axis 1a.

When completely processing the substrate 9, the thermal processing apparatus 1001 stops supplying power to the lamp groups 1041 and 1042 and reduces the temperature in the processing space 1010. Consequently, the first and second auxiliary rings 1031 and 1032 and the screening ring 1034 are contracted while the diameters of the cylindrical member 1033 and the arrangement of the support part 1035 are also slightly reduced, so that the widths L1 to L3 shown in FIG. 28, i.e., the clearances between the cylindrical surfaces 1321a and 1312a, between the cylindrical surfaces 1331a and 1322a and between the surface 1351a and the cylindrical surface 1342a are reduced and the arrangement of the respective structures returns to the state shown in FIG. 27.

The thermal processing apparatus 1001 is so designed as to set the widths L1 to L3 to slight distances at the ordinary temperature. Even if the center of the first or second auxiliary ring 1031 or 1032 or the screening ring 1034 deviates from the central axis 1a of the apparatus 1001 in heating, therefore, it follows that the concave portion 1312, 1322 or 1342 comes into contact with the convex portion 1321 or 1331 or the support pin 1351 on any position to substantially return the positions of the rings 1031, 1032 and 1034 to the states shown in FIG. 27. Consequently, the thermal processing apparatus 1001 Limits deviation of the first and second auxiliary rings 1031 and 1032 and the screening ring 1034 therein also when repeating thermal processing.

When designed to set the widths L1 to L3 to 0.1 mm under a low temperature, for example, the thermal processing apparatus 1001 limits the quantities of deviation of the center of the first auxiliary ring 1031 and the centers of the second auxiliary ring 1032 and the screening ring 1034 with respect to the central axis 1a to about 0.2 mm at the maximum and about 0.1 mm at the maximum respectively.

As a result, the thermal processing apparatus 1001 reliably prevents light from the lamps from entering the radiation thermometers 1051 also when suppressing overlaps between the substrate 9 and the first auxiliary ring 1031, between the first and second auxiliary rings 1031 and 1032 and between the second auxiliary ring 1032 and the screening ring 1034 respectively. Consequently, the thermal processing apparatus 1001 can suppress temperature irregularity caused in the substrate 9 and the first and second auxiliary rings 1031 and 1032 due to large overlaps or circumferentially inconstant overlaps, for improving temperature uniformity of the substrate 9 in heating. Further, the position of the first auxiliary ring 1031 is substantially constant in non-heating, whereby the thermal processing apparatus 1001 can readily place the substrate 9 on the first auxiliary ring 1031.

Figure 29:
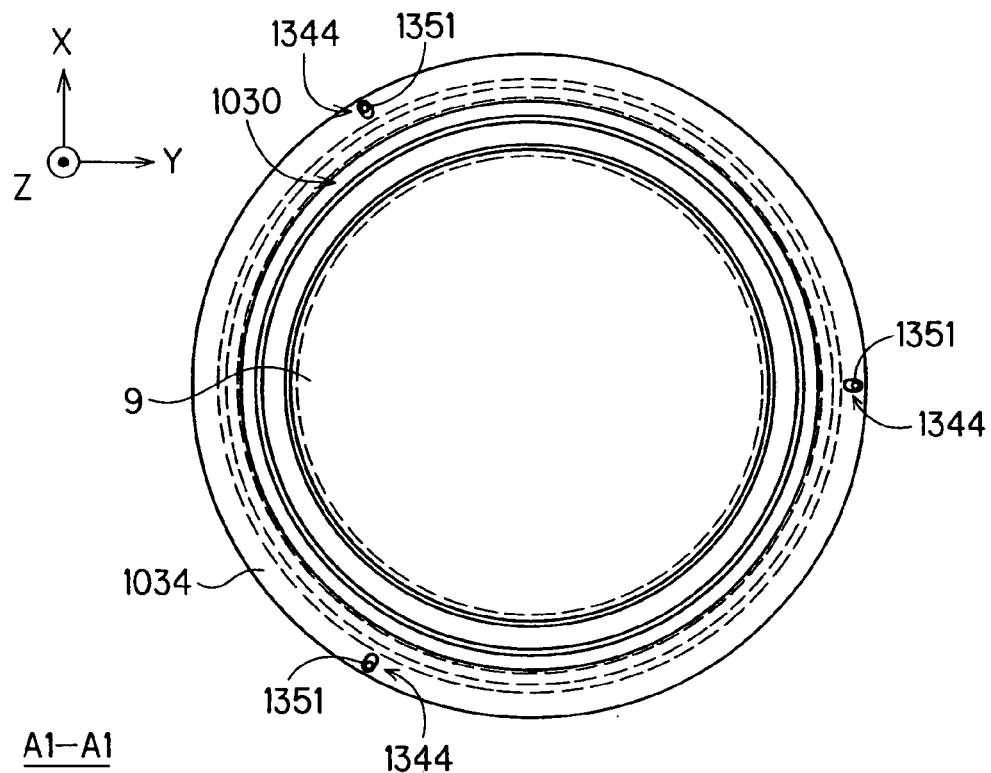
FIG. 29 illustrates another exemplary screening ring.

While the annularly recessed concave portion 1342 is provided on the lower surface of the screening ring 1034 in the aforementioned seventh preferred embodiment, slots 1344 may alternatively formed on a screening ring 1034 as shown in FIG. 29, for example, for positioning the screening ring 1034 with support pins 1351 and the slots 1344 under a low temperature. In this case, outer surfaces, directed toward a substrate 9, of the slots 1344 and outwardly directed side surfaces of the support pins 1351 approach or come into contact with each other under a low temperature thereby preventing the screening ring 1034 from displacement. Similarly, the first or second auxiliary ring 1031 or 1032 may alternatively be formed with a slot or a groove in the form of a slot in place of the concave portion 1312 or 1322 and the second auxiliary ring 1032 or the cylindrical member 1033 may be provided with a substantially pin-shaped convex portion engaged in the slot in place of the convex portion 1321 or 1331.

Figure 30:
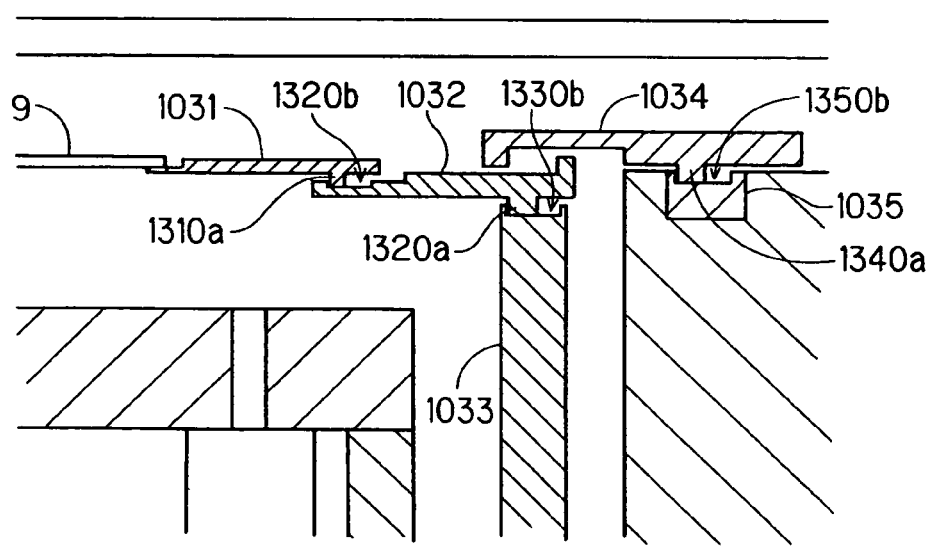
FIG. 30 illustrates another exemplary auxiliary ring group and still another exemplary screening ring.

As shown in FIG. 30, first and second auxiliary rings 1031 and 1032 and a screening ring 1034 may be formed with downwardly projecting substantially pin-shaped convex portions 1310a, 1320a and 1340a respectively, and the second auxiliary ring 1032, a cylindrical member 1033 and a support part 1035 may be formed with concave portions 1320b, 1330b and 1350b engaged with the concave portions 1310a, 1320a and 1340a respectively. In this case, surfaces of the side surfaces of the convex portions 1310a, 1320a and 1340a directed toward a substrate 9 and outwardly directed surfaces of the concave portions 1320b, 1330b and 1350b approach or come into contact with each other under a low temperature thereby preventing the first and second auxiliary rings 1031 and 1032 and the screening ring 1034 from displacement.

As hereinabove described, various structures can be employed for limiting the positions of ring-shaped members such as the auxiliary ring group 1030 and the screening ring 1034 spreading along the outer periphery of the substrate 9 under a low temperature. When the ring-shaped members expand beyond support-side members in heating due to temperature difference or difference in thermal expansion coefficient, surfaces of the ring-shaped members directed to the substrate 9 and opposed surfaces of the support-side members are generally so approximated to each other that clearances between the surfaces opposite to each other are reduced and displacement of the ring-shaped members can be limited under a low temperature.

While the ring-shaped members expand beyond the support-side members in heating due to temperature difference or difference in thermal expansion coefficient in the aforementioned seventh preferred embodiment, the support-side members may conceivably expand beyond the ring-shaped members in heating depending on selected materials. In this case, outwardly directed surfaces of the ring-shaped members and opposed surfaces (directed to the substrate 9) of the support-side members are so approximated to each other that clearances between the surfaces opposite to each other are reduced and displacement of the ring-shaped members can be limited under a low temperature.

The auxiliary ring group 1030 in the aforementioned seventh preferred embodiment may alternatively be formed by a single auxiliary ring, while a separately provided support member may support the substrate 9 so that the auxiliary ring group 1030 outwardly spreads from the outer edge of the substrate 9.

The lamps for irradiating the substrate 9 with light may not necessarily be provided as the upper and lower lamp groups 1041 and 1042 perpendicular to each other, but the thermal processing apparatus 1001 may alternatively be provided with only either the upper or lower lamp group 1041 or 1042. Further, the thermal processing apparatus 1001 may irradiate the substrate 9 with lamp light from the upper and lower surfaces thereof.

The substrate 9 processed by the thermal processing apparatus 1001 is not restricted to a semiconductor substrate but the substrate processing apparatus 1001 can also be utilized for thermally processing a glass substrate for a flat panel display such as a liquid crystal display or a plasma display.

Figure 31:
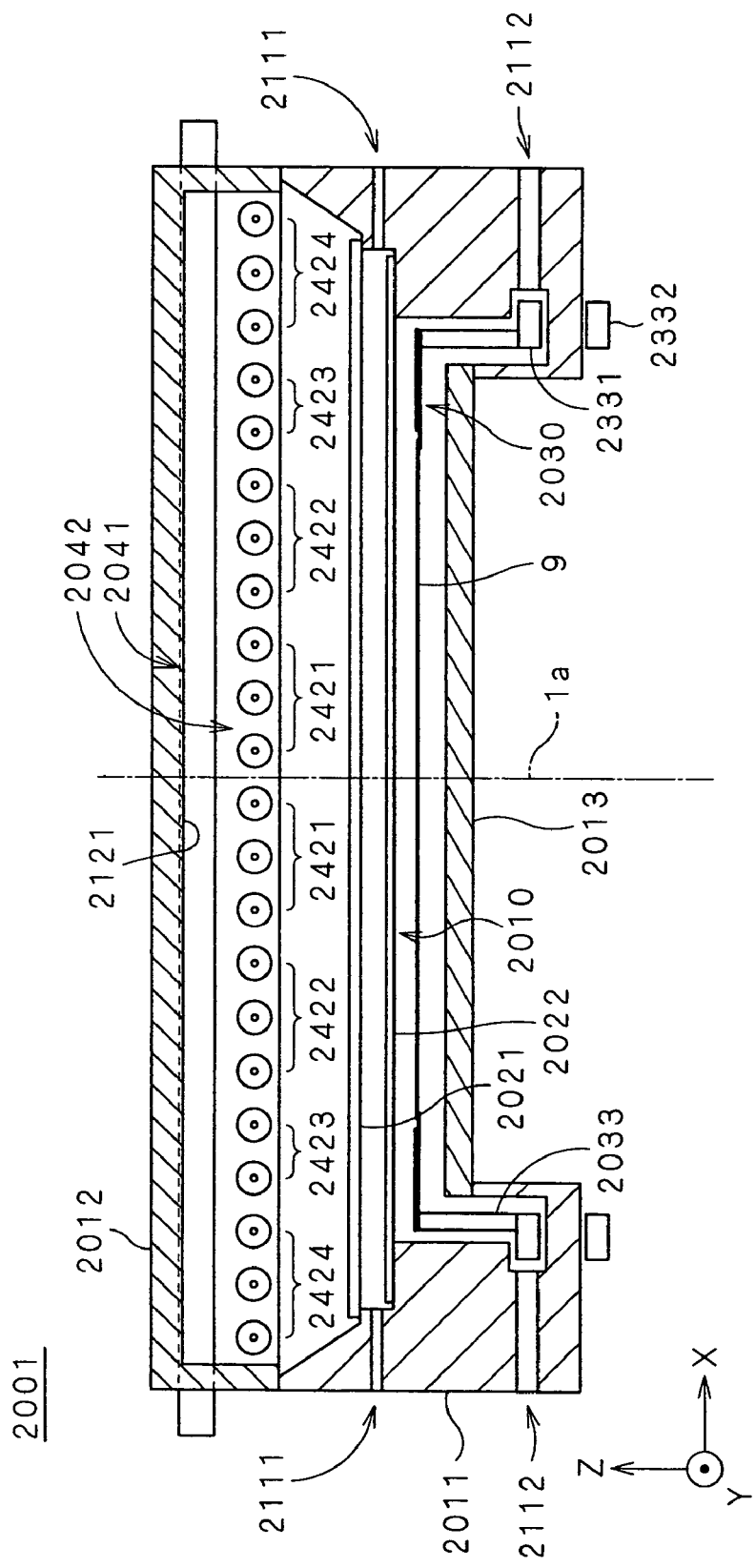
FIGS. 31 and 32 are longitudinal sectional views showing a thermal processing apparatus according to an eighth preferred embodiment of the present invention.
Figure 32:
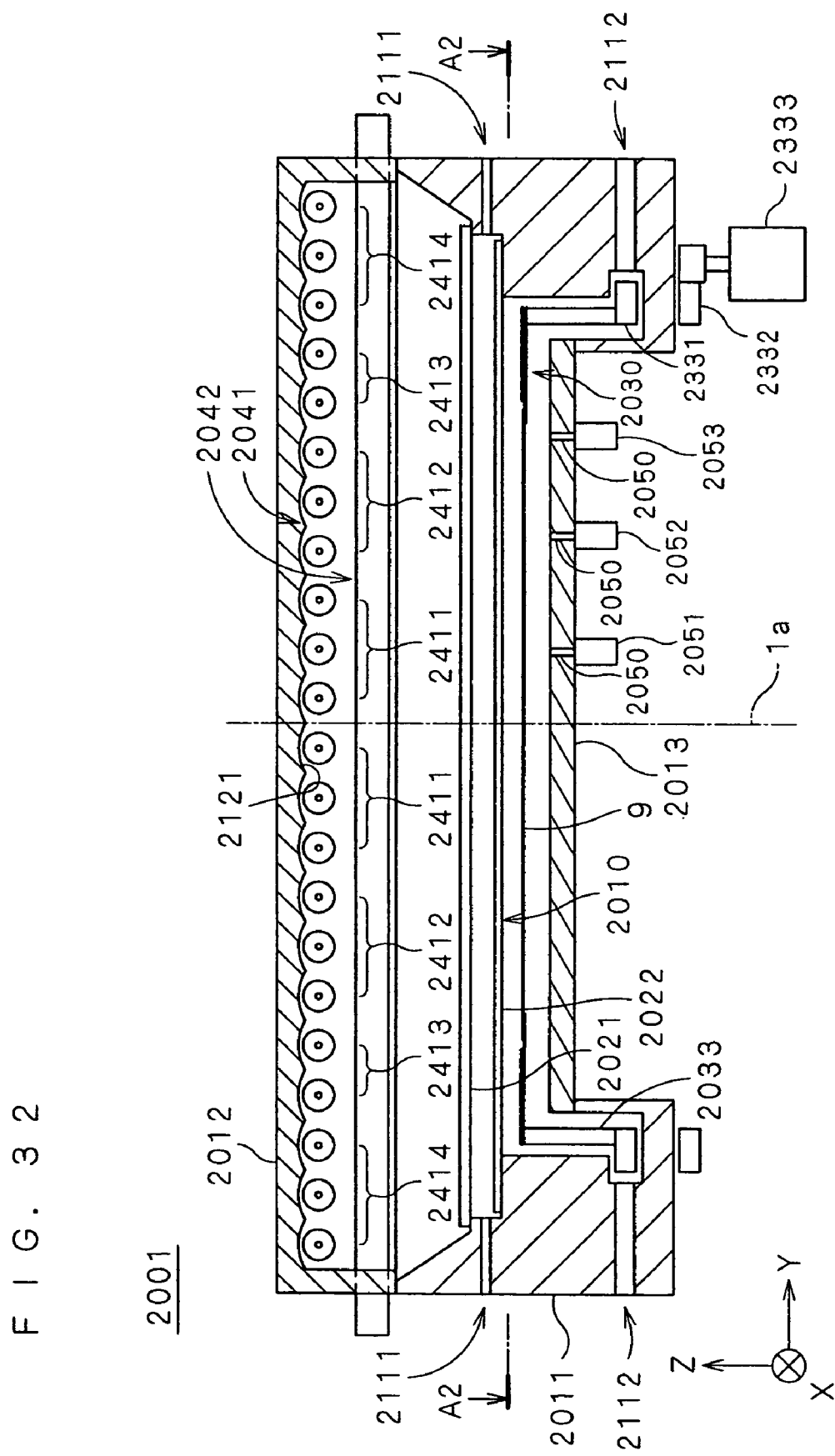

FIGS. 31 and 32 are longitudinal sectional views showing the structure of a thermal processing apparatus 2001 according to an eighth preferred embodiment of the present invention, and cutting planes in FIGS. 31 and 32 perpendicularly intersect with each other at a central axis 1a of the thermal processing apparatus 2001 directed to a direction Z. FIGS. 31 and 32 omit parallel oblique lines with respect to sections of details.

The thermal processing apparatus 2001 has a body part 2011 forming the apparatus body, a lid part 2012 covering the upper portion of the body part 2011 and a reflector 2013 arranged on the central bottom surface of the body part 2011, which form an internal space. A chamber window 2021 of quartz vertically partitions the internal space, and a support ring group 2030 described later supports a substrate 9 in a lower processing space 2010. An O-ring (not shown) seals the clearance between the chamber window 2021 and the body part 2011, which has a cylindrical inner side surface.

A plurality of gas inlets 2111 and a plurality of outlets 2112 are formed on the side wall of the body part 2011. The processing space 2010 performs gas replacement by (enforcedly) discharging gas from the outlets 2112 while introducing gas (e.g., nitrogen, oxygen or the like) responsive to the type of processing performed on the substrate 9 through the gas inlets 2111. The thermal processing apparatus 2001 is provided with a shower plate 2022 of quartz formed with a large number of holes between the substrate 9 and the chamber window 2021, for homogeneously supplying the gas introduced from the gas inlets 2111 to the upper surface of the substrate 9 through the shower plate 2022. The gas employed for the processing is guided to the outlets 2112 from below the processing space 2010.

As shown in FIGS. 31 and 32, a cylindrical member 2033 centered at a central axis 1a supports the support ring group 2030, while a coupling member 2331 is mounted on the lower end of the cylindrical member 2033. Another coupling member 2332 opposed to the coupling member 2331 is provided under the body part 2011 so that the coupling members 2331 and 2332 form a magnetic coupling mechanism. The coupling member 2332 rotates about the central axis 1a through a motor 2333 shown in FIG. 32. Thus, the coupling member 2331 provided in the body part 2011 rotates due to magnetic action, while the substrate 9 and the support ring group 2030 rotate about the central axis 1a.

The lower surface of the lid part 2012 defines a reflecting surface (hereinafter referred to as "reflector") 2121 opposed to the upper surface of the substrate 9, and a bar-shaped upper lamp group 2041 is arranged along the reflector 2121 so that respective lamps are along a direction X in FIG. 31. The reflector 2121 reflects a component of light upwardly emitted from the upper lamp group 2041 and applies the same to the substrate 9.

A bar-shaped lower lamp group 2042 is arranged under the upper lamp group 2041, i.e., between the upper lamp group 2041 and the substrate 9, so that respective lamps are along a direction Y. In other words, the upper and lower lamp groups 2041 and 2042 are mounted on the lid part 2012 to be perpendicularly to each other.

Each of the upper and lower lamp groups 2041 and 2042 is divided into small groups in response to distances from the central axis 1a. FIG. 32 shows lamps 2411, 2412, 2413 and 2414 of the upper lamp group 2041 grouped successively from the side of the central axis 1a, and FIG. 31 shows lamps 2421, 2422, 2423 and 2424 of the lower lamp group 2042 grouped successively from the side of the central axis 1a.

Figure 33:
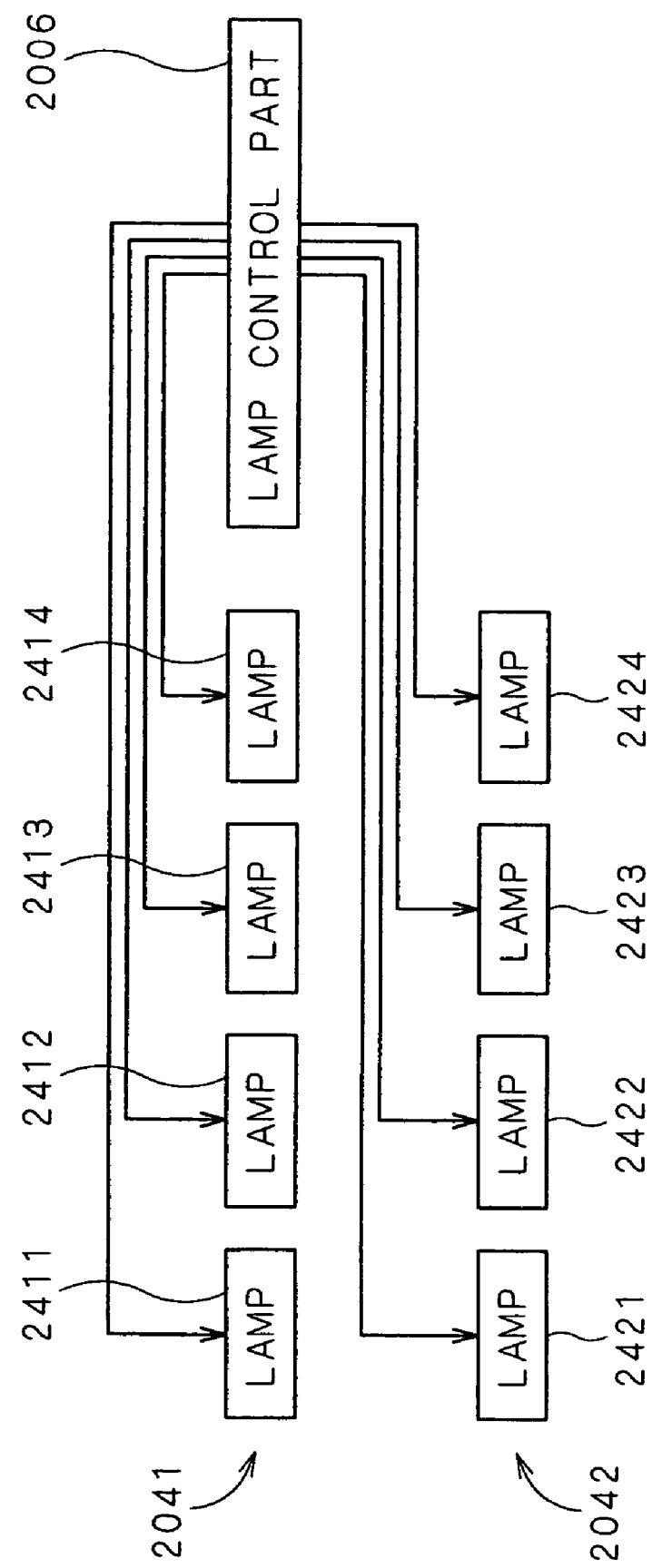
FIG. 33 is a block diagram showing lamps and a lamp control part.

FIG. 33 is a block diagram showing the connectional relation between the grouped lamps 2411, 2412, 2413, 2414, 2421, 2422, 2423 and 2424 and a lamp control part 2006 supplying power to the lamps 2411, 2412, 2413, 2414, 2421, 2422, 2423 and 2424 (each block shows a plurality of lamps). As shown in FIG. 33, the grouped lamps 2411, 2412, 2413 and 2414 of the upper lamp group 2041 and the grouped lamps 2421, 2422, 2423 and 2424 of the lower lamp group 2042 are individually connected to the lamp control part 2006, and supplied with power independently of each other. Thus, intensity distribution of light applied to the upper surface of the substrate 9 is controlled.

Figure 34:
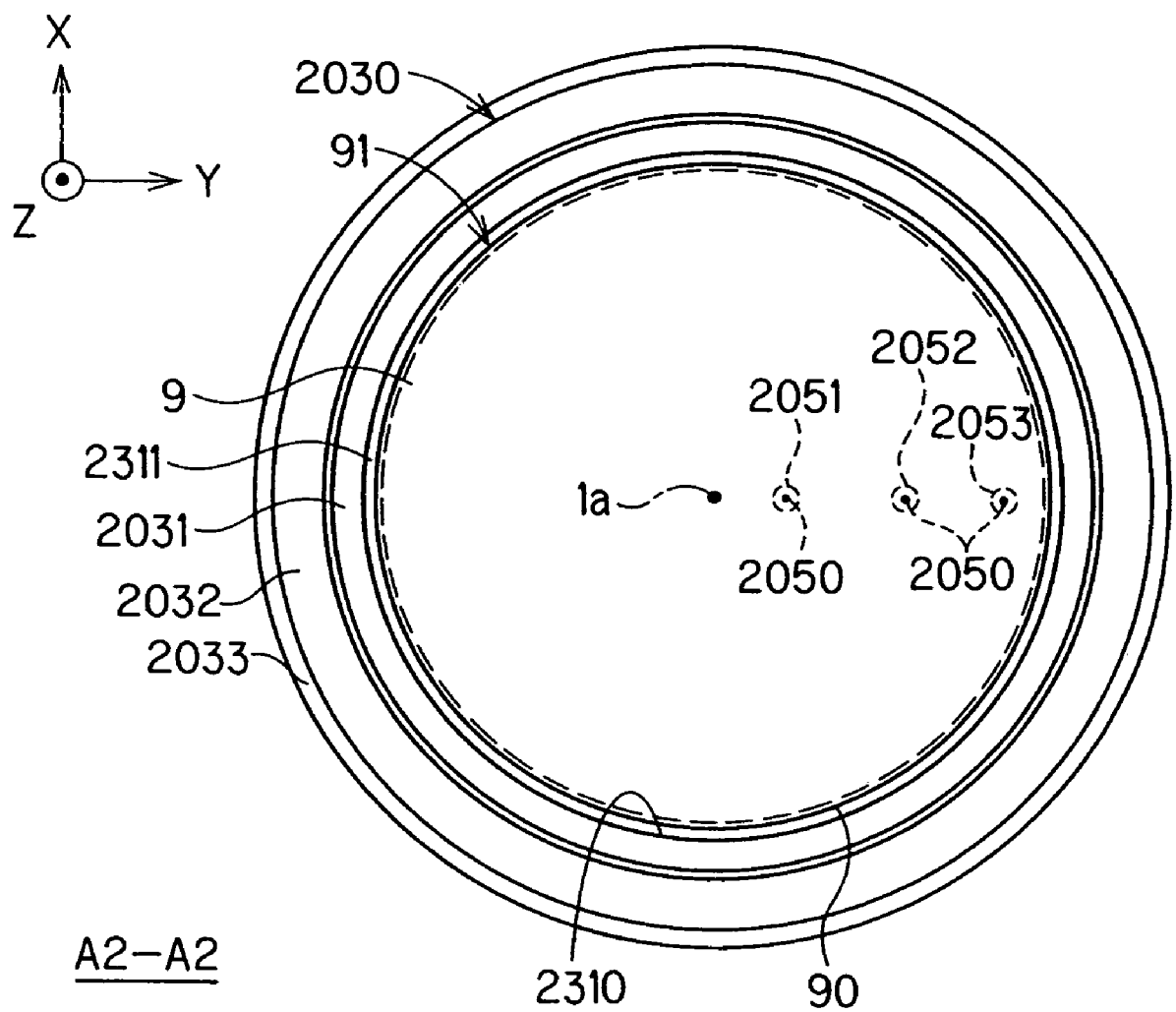
FIG. 34 is a plan view showing the inside of a cylindrical member.
Figure 35:
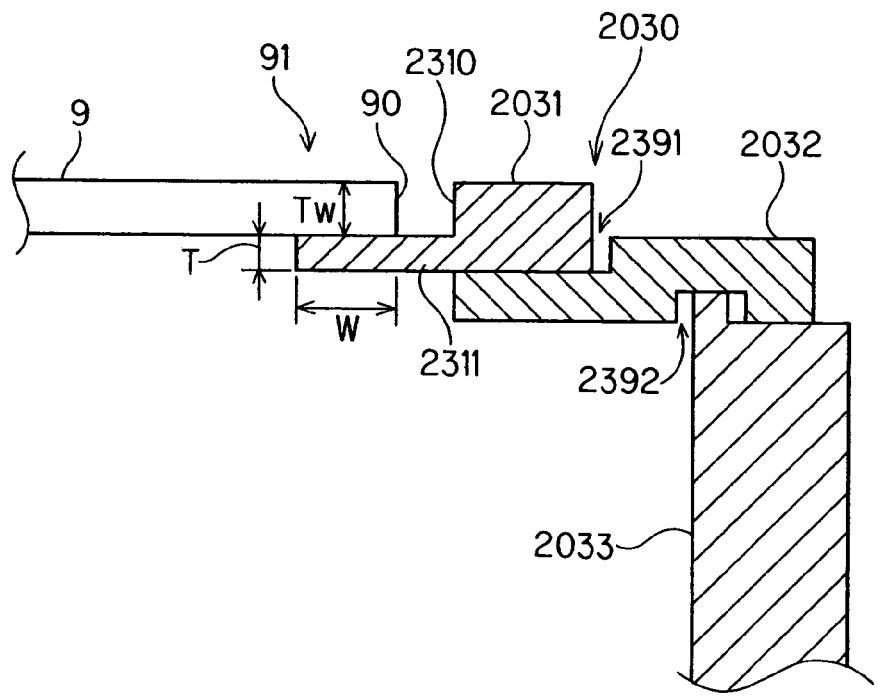
FIG. 35 is an enlarged sectional view showing a support ring group supporting a substrate.

FIG. 34 illustrates the inside of the cylindrical member 2033 along arrows A2 in FIG. 32, and FIG. 35 is an enlarged sectional view showing the support ring group 2030 supporting the substrate 9.

As shown in FIGS. 34 and 35, the support ring group 2030 is formed by an annular auxiliary ring 2031 receiving the substrate 9 thereon and an annular cushion ring 2032 supporting the auxiliary ring 2031 from outside. Both of the auxiliary ring 2031 and the cushion ring 2032 are made of silicon carbide (SiC) having specific heat capacity close to that of the substrate 9. The auxiliary ring 2031 has an annular support part 2311 projecting toward the central axis 1a on its inner peripheral surface 2310, so that the support part 2311 comes into contact with the substrate 9 transported into the processing space 2010 by an external transport mechanism from below thereby supporting the same. When the substrate 9 is placed on the auxiliary ring 2031, an outer peripheral surface 90 of the substrate 9 and an inner peripheral surface 2310 of the auxiliary ring 2031 are opposed to each other while the auxiliary ring 2031 is positioned to outwardly spread from the outer edge 91 of the substrate 9. In the following description, the thickness of the substrate 9 is referred to as a substrate thickness Tw, the thickness of the support part 2311 is referred to as a support part thickness T and the width of overlapping portions of the substrate 9 and the support part 2311 is referred to as a support width W, as shown in FIG. 35.

The aforementioned cylindrical member 2033 supports the concentric annular cushion ring 2032 supporting the auxiliary ring 2031 from outside. As shown in FIG. 35, engaging portions 2391 and 2392 between the auxiliary ring 231 and the cushion ring 2032 and between the cushion ring 2032 and the cylindrical member 2033 have clearances (slacks) respectively. Also when swollen with heat, therefore, the auxiliary ring 2031 and the cushion ring 2032 are prevented from cracking resulting from excess stress.

As shown in FIGS. 32 and 34, a plurality of radiation thermometers 2051 to 2053 are mounted under the substrate 9 outwardly from the central axis 1$a$. The radiation thermometers 2051 to 2053 receive infrared light from the substrate 9 through a window member 2050 provided on the reflector 2013 thereby measuring the temperature of the substrate 9. The plurality of radiation thermometers 2051 to 2053 measure the temperature of the substrate 9 placed on the support ring group 2030 and rotated in response to distances from the central axis 1$a$. At this time, the substrate 9, the support ring group 2030 and the cylindrical member 2033 inhibit infrared radiation from the lamp groups 2041 and 2042 from entering the radiation thermometers 2051 to 2053, so that the radiation thermometers 2051 to 2053 correctly measure the temperature.

When performing processing accompanied by heating on the substrate 9, the thermal processing apparatus 2001 controls power supplied to the lamps 2411 and 2421 in response to results of measurement of the radiation thermometers 2051 while controlling power supplied to the lamps 2412, 2422, 2413 and 2423 in response to results of measurement of the radiation thermometers 2052 and 2053 respectively, for example. The thermal processing apparatus 2001 supplies power to the lamps 2414 and 2424 mainly irradiating the auxiliary ring 2031 with infrared radiation according to a predetermined profile. At this time, a rotation mechanism formed by the motor 2333 and the coupling mechanism rotates the substrate 9 and the support ring group 2030, and the thermal processing apparatus 2001 controls heating of the substrate 9 so that the temperature thereof is as uniform as possible.

Figure 2:
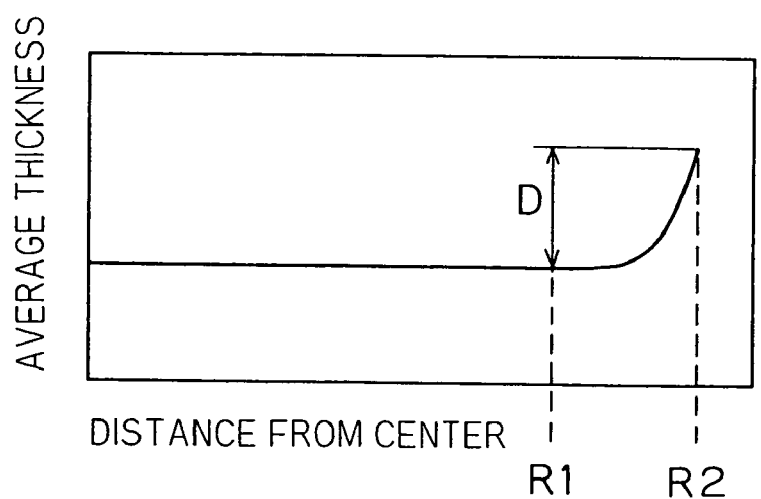
FIG. 2 illustrates the relation between a distance from the center of the substrate and the thickness of an oxide film.
Figure 36:
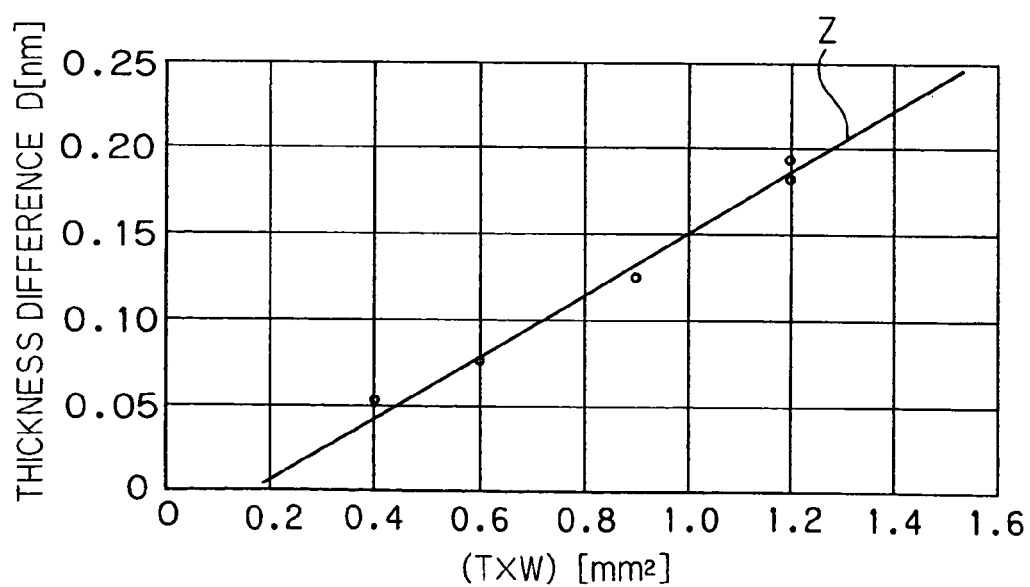
FIG. 36 illustrates the relation between thickness difference D and a product (T×W)

FIG. 36 illustrates the relation between thickness difference D (see FIG. 2) between the outer edge and the center of the substrate 9 and the product (T×W) of the support part thickness T and the support width W when forming an oxide film through an RTP in the thermal processing apparatus 2001 and varying the support part thickness T and the support width W shown in FIG. 35 as shown in FIG. 37.

In measurement, the substrate 9 having a diameter 200 mm and a substrate thickness Tw of 0.725 mm was rapidly heated to a target temperature of 1100° C. at about 100° C./s and thereafter held at the target temperature for 60 seconds. In order to obtain the thickness difference D, thicknesses were measured on a position (corresponding to that of the distance R2 in FIG. 2) of 2 mm inside the outer edge of the substrate 9 and a position (corresponding to that of the distance R1 in FIG. 2) of 10 mm inside the outer edge of the substrate 9 respectively. It has been confirmed that the thickness was substantially constant inside the position of 10 mm inside the outer edge of the substrate 9 and the average thickness was about 11 nm.

It is understood from FIG. 36 that proportionality is present between the thickness difference D and the product (T×W), as shown by a straight line Z. Assuming that allowable dispersion of the thickness is ±1%, allowable thickness difference D is about 0.22 nm (2% of the average thickness of 11 nm). According to the straight line Z, therefore, it can be said possible to reduce dispersion of the thickness to not more than ±1% if the product (T×W) is not more than about 1.5 mm². Considering that dispersion of the thicknesses is influenced by the support part thickness T and the support width W as the substrate thickness Tw is reduced and that the substrate 9 having the substrate thickness Tw of 0.725 mm was used in measurement, it is estimated that dispersion of the thickness can be rendered within ±1% of the average thickness when a numerical value $(T_1 \times W_1)$ obtained in terms of "mm²," of the product (T×W) is not more than about twice a numerical value $(TW_1)$ obtained in terms of "mm" of the substrate thickness TW. In other words, temperature uniformity of the substrate 9 can be improved by satisfying relation expressed as $((T_1 \times W_1) \leq (Tw_1 \times 2))$.

Figure 1:
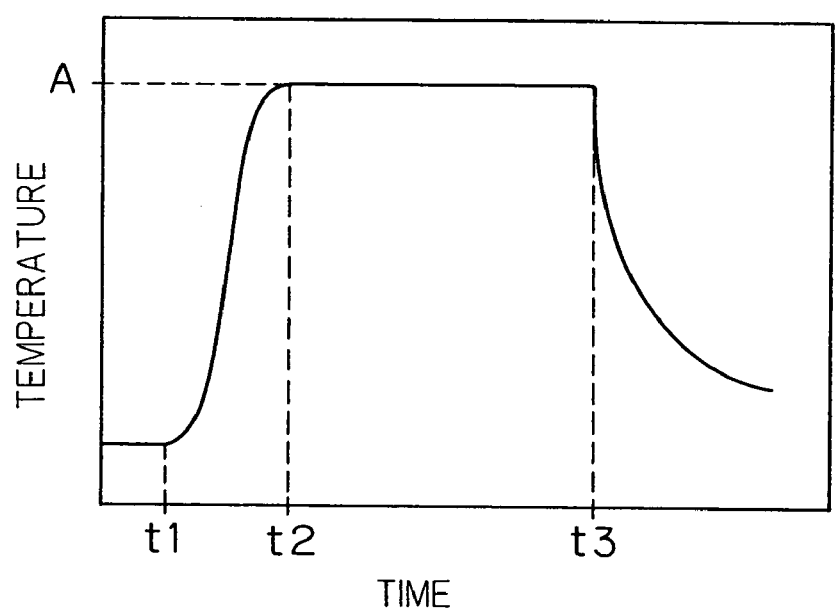
FIG. 1 illustrates the relation between the temperature of a substrate and the time.

When the thermal processing apparatus 2001 actually perform the RTP, the thermal capacity per unit area is increased on a portion where the substrate 9 and the auxiliary ring 2031 overlap with each other, i.e., on the outer edge of the substrate 9, in a temperature increase step similar to that shown in FIG. 1 (between the times t1 and t2), and hence temperature increase is retarded. Therefore, the thermal processing apparatus 2001 sets power supplied to the lamps 2414 and 2424 higher than that supplied to the remaining lamps 2411, 2412, 2413, 2421, 2422 and 2423 in order to sufficiently heat the auxiliary ring 2031.

According to this setting, however, the temperature of the auxiliary ring 2031 exceeds that of the substrate 9 in a holding step (between the times t2 and t3) such that heat is transferred from the auxiliary ring 2031 to increase the temperature of the outer edge of the substrate 9 beyond those of the remaining portions. The thermal processing apparatus 2001 limits the shape, shown by the support part thickness T and the support width W, of the portion where the substrate 9 and the auxiliary ring 2031 overlap with each other by the substrate thickness Tw thereby suppressing temperature difference between the outer edge and the center of the substrate 9 in the holding step. In other words, the thermal processing apparatus 2001 improves temperature uniformity of the substrate 9 by limiting a heat transfer path from the auxiliary ring 2031 to the substrate 9.

While it can be said preferable that the product (T×W) is not more than 1.5 mm² when forming a film of an ordinary thickness of about 10 nm from FIG. 36, it is preferable that the support part thickness T and the support width W are rendered not more than 0.5 mm and not more than 3 mm respectively considering that this condition has been guided from the measurement range shown in FIG. 37. In consideration of a point that reliable measurement results are obtained, it can be said more preferable to render the product $(T \times_2 W)$ and the support part thickness T not more than 1.2 mm² and not more than 0.4 mm respectively.

While the above eighth preferred embodiment has been described with reference to formation of an oxide film on the substrate 9, the thermal processing apparatus 2001 may alternatively perform processing accompanied by heating other than formation of an oxide film. Further, the size and the thickness of the substrate 9 may also be varied.

The support ring group 2030 may not necessarily be formed by the auxiliary ring 2031 and the cushion ring 2032, but the cushion ring 2032 may be omitted while leaving only the auxiliary ring 2031.

The shape of the auxiliary ring 2031 is not restricted to that in the aforementioned eighth preferred embodiment but the auxiliary ring 2031 may alternatively be a simple plate-shaped torus having no inner peripheral surface 2310 (i.e., the support part thickness T defines the thickness of the auxiliary ring 2031), or an annular projection having a surface opposed to the outer peripheral surface of the substrate 9 may be provided on the upper surface of a simple plate-shaped torus.

While the thermal processing apparatus 2001 rotates the substrate 9, the former may rotate the latter only at need.

The lamps for irradiating the substrate 9 with light may not necessarily be provided as the upper and lower lamp groups 2041 and 2042 perpendicular to each other but the thermal processing apparatus 2001 may be provided with only either the upper or lower lamp group 2041 or 2042. Further, the thermal processing apparatus 2001 may alternatively irradiate the substrate 9 with light from the upper and lower surfaces thereof.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus capable of heating a substrate with light, comprising:
    a lamp irradiating said substrate with said light;
    a ring enclosing the outer edge of said substrate and outwardly spreading from said outer edge; and
    an image pickup system capturing images of a plurality of portions of said ring, further comprising a rotation mechanism rotating said ring while directing said ring toward a prescribed direction.

2. A thermal processing apparatus capable of heating a substrate with light, comprising:
    a lamp irradiating said substrate with said light;
    a ring enclosing the outer edge of said substrate and outwardly spreading from said outer edge; and
    an image pickup system capturing images of a plurality of portions of said ring, wherein
    said image pickup system includes a plurality of image pickup parts set on different positions.

3. The thermal processing apparatus according to claim 2, wherein
    said image pickup system includes at least three said image pickup parts set on different positions.

4. A thermal processing apparatus capable of heating a substrate with light, comprising:
    a lamp irradiating said substrate with said light;
    a ring enclosing the outer edge of said substrate and outwardly spreading from said outer edge; and
    an image pickup system capturing images of a plurality of portions of said ring, further comprising a chamber storing said lamp, said ring and said substrate, wherein
    said chamber is formed with an opening so that said image pickup system captures said images of said ring from outside said chamber through said opening.

5. The thermal processing apparatus according to claim 4, wherein
    said opening is formed on a position closer to said lamp than said substrate.

6. The thermal processing apparatus according to claim 4, further comprising a light source part emitting illumination light for illuminating said ring through said opening.

7. A thermal processing apparatus capable of heating a substrate with light, comprising:
    a lamp irradiating said substrate with said light;
    a ring enclosing the outer edge of said substrate and outwardly spreading from said outer edge; and
    an image pickup system comprising a plurality of image pickup parts capturing images of said outer edge of said substrate, wherein
    said image pickup system comprises at least three said image pickup parts.

8. A thermal processing apparatus capable of heating a substrate with light, comprising:
    a lamp irradiating said substrate with said light;
    a ring enclosing the outer edge of said substrate and outwardly spreading from said outer edge; and
    an image pickup system comprising a plurality of image pickup parts capturing images of said outer edge of said substrate, wherein
    said image pickup system also captures an image of said ring.

9. The thermal processing apparatus according to claim 8, wherein
    the respective ones of said plurality of image pickup parts simultaneously capture respective said images of said outer edge of said substrate and said ring.

10. A thermal processing apparatus capable of heating a substrate with light, comprising:
    a lamp irradiating said substrate with said light;
    a ring enclosing the outer edge of said substrate and outwardly spreading from said outer edge; and
    an image pickup system comprising a plurality of image pickup parts capturing images of said outer edge of said substrate, further comprising a chamber storing said lamp, said ring and said substrate, wherein
    an opening is formed in said chamber so that said image pickup system captures said images of said outer edge of said substrate from outside said chamber through said opening.

11. The thermal processing apparatus according to claim 10, wherein
    said opening is formed on a position closer to said lamp than said substrate.

12. The thermal processing apparatus according to claim 10, farther comprising a light source part emitting illumination light illuminating at least said outer edge of said substrate through said opening.

* * * * *